United States Patent
Suhara et al.

(10) Patent No.: US 7,273,166 B2
(45) Date of Patent: Sep. 25, 2007

(54) COMPONENT INFORMATION APPLYING METHOD AND APPARATUS

(75) Inventors: Shinsuke Suhara, Kariya (JP); Seigo Kodama, Ama-gun (JP)

(73) Assignee: Fuji Machine MFG. Co., Ltd., Chiryu (JP)

( * ) Notice: Subject to any disclaimer, the term of this patent is extended or adjusted under 35 U.S.C. 154(b) by 527 days.

(21) Appl. No.: 10/702,612

(22) Filed: Nov. 7, 2003

(65) Prior Publication Data

US 2005/0036274 A1 Feb. 17, 2005

(30) Foreign Application Priority Data

| Nov. 11, 2002 | (JP) | ............................. 2002-326942 |
| Jul. 10, 2003 | (JP) | ............................. 2003-194801 |

(51) Int. Cl.
*G06F 17/00* (2006.01)

(52) U.S. Cl. .................. 235/376; 700/221; 700/222; 235/462.01

(58) Field of Classification Search ................ 235/376, 235/462.01; 700/221, 222; 242/563
See application file for complete search history.

(56) References Cited

U.S. PATENT DOCUMENTS

| 5,494,168 A * | 2/1996 | Hart ............... 206/714 |
| 6,631,868 B2 * | 10/2003 | Miller et al. ............ 242/563 |
| 6,631,870 B2 * | 10/2003 | Bergstrom ............ 242/615 |
| 6,694,606 B1 * | 2/2004 | Ohashi et al. ............ 29/740 |
| 6,779,726 B1 * | 8/2004 | Easton ............ 235/462.01 |
| 6,901,311 B2 * | 5/2005 | Eschenweck ............ 700/220 |
| 2004/0039480 A1 * | 2/2004 | Kou ............ 700/222 |
| 2004/0094564 A1 * | 5/2004 | Papp ............ 221/25 |

* cited by examiner

*Primary Examiner*—Daniel Hess
(74) *Attorney, Agent, or Firm*—Oliff & Berridge, PLC

(57) ABSTRACT

The invention improves supply of an electronic circuit components by a component tape. When a number of the components remaining in each feeder becomes equal to or smaller than a predetermined number, an operator is informed of a fact that another component tape can be connected to a currently used component tape. In response to the informed fact, the operator connects the currently used component tape as a preceding component tape to the above-described another component tape as a following tape such that a trailing end portion of the preceding component tape and a leading end portion of the following component tape are connected through a connecting tape. A connecting portion of the two connected component tapes is detected by a connecting-portion detecting device in S11, and a two-dimensional code printed on the connecting tape is recognized by an ID decoder in S12. S13 is then implemented to determine whether each data element of the two-dimensional code corresponds to the corresponding data element of a bar code of the preceding component tape or not. If a positive decision is obtained in S13, the component supply is continued. If a negative decision is obtained in S13, the component supply is suspended. It is also possible to use, in place of the two-dimensional code and bar code, an information medium piece to and from which the information is writable and readable by means of a light such as laser light, or an information communication storage chip equipped with a communication portion.

16 Claims, 16 Drawing Sheets

COMPONENT INFORMATION APPLYING METHOD AND APPARATUS

BACKGROUND OF THE INVENTION

1. Field of the Invention

The present invention relates to an electronic-circuit-component supplying method of supplying electronic circuit components in the form of component supplying tape or component tape, a method of providing an identification code in the component tape, and a method of providing information in the component supplying tape. The invention also relates to a component-tape connecting member, a connecting-member supplying device, an electronic-circuit-component supplying system and an electronic-circuit-component mounting system which are favorable for carrying out the above-described methods.

2. Discussion of Related Art

As one form of electronic-circuit-component supplying system, there is a system including a tape feeder arranged to feed a component tape which includes a carrier tape and a plurality of electronic circuit components arranged in a longitudinal direction of the carrier tape, in the longitudinal direction of the carrier tape, for thereby positioning each of the plurality of electronic circuit components in a predetermined supplying position. In such a form of electronic circuit component supplying system, if a wrong component tape which is different in kind from a predetermined one were erroneously installed on the tape feeder, unexpected electronic circuit components would be supplied. For example, where the electronic circuit component supplying system is used as a part of electronic circuit component mounting system for assembling an electronic circuit by mounting electronic circuit components onto a circuit board such as a printed-wiring board, unexpected electronic circuit components are mounted on the circuit board in the event of erroneous installation of a wrong component tape on the tape feeder, resulting in fabrication of defective electronic circuit.

For avoiding occurrence of such an inconvenience, conventionally, an identification information is provided in a tape reel, a tape storing box or other member which stores the component tape, wherein the identification information relates to the electronic circuit components of the component tape. The identification information is provided in the member storing the component tape, by printing a bar code, a two-dimensional code or other identification code onto the storing member, or by affixing a label having a printed identification code, onto the storing member. For example, when the component tape is installed on the tape feeder, the identification code is recognized by an identification-code recognizing device such as a bar code reader, whereby it is determined whether the recognized identification code corresponds to a predetermined identification code or not. If not, an operator of the system is informed of the fact (for example, see Patent Document 1)). This kind of system will be referred to as erroneous-installation preventing system in the present specification.

[Patent Document 1]
JP-A-2002-271089

SUMMARY OF THE INVENTION

However, there is a case where it is inconvenient that the identification information relating to the component tape is provided in the component-tape storing member such as the tape reel. For example, when a tape splicing is effected, supply of wrong electronic circuit components can not be prevented. The tape splicing is an operation effected, when a number of the electronic circuit components of the component tape presently supplying the electronic circuit components has become small, for connecting another component tape supposed to next supply the components, to the presently used component supplying tape. In this operation, a tail end portion or trailing end portion of the preceding component tape is connected to a top end portion or leading end portion of the subsequent component tape through a connecting member. By thus connecting the two component tapes at their end portions, it is possible to continue supply of the electronic circuit components, without suspension of the component supply or with a reduced number of the suspension of the component supply. This is contrast to an arrangement where the preceding component tape is replaced with the subsequent component tape, and leads to improvement in efficiency of the component supply. However, since the conventional erroneous-installation preventing system can not be used in the case where the tape splicing is thus effected, there is no alternative but to depend on a cautious attention paid by the operator, for preventing erroneous supply of wrong electronic circuit components.

The conventional erroneous-installation preventing system suffers from inconvenience not only in the operation of the tape splicing but also in other instance. For example, after each feeder holding the tape reel is installed on a feeder holder base, the identification code of the component tape or the component-tape code can no longer be recognized by the identification-code recognizing device. It is common that the identification code is provided on a side face of the tape reel, and that the feeder holder base holds a plurality of feeders which are positioned to be closed to each other. That is, in this arrangement in which there is no large spacing distance between the mutually opposed side surfaces of the tape reels, the identification-code recognizing device can not be positioned to be opposed to the identification code.

The present invention was developed under the above-described background situation and has an object of providing an improvement in the supply of the electronic circuit components by the component tape. Owing to the present invention, it is possible to obtain a component-tape connecting member, a connecting-member supplying device, an electronic-circuit-component supplying system, an electronic-circuit-component mounting system, a component-tape code providing method, a component-information providing method and an electronic-circuit-component supplying method which are described below in modes, each of which is numbered like claims and depends from the other mode or modes, as needed, for easier understanding of the present invention. It is to be understood that the technical features or any combinations thereof disclosed in the present specification is not limited to what are described in the following modes. It is to be further understood that a plurality of elements or features included in any one of the following modes (1)-(32), (41)-(47), (50)-(52), (60)-(64), (70)-(76), (80)-(82), (90) and (100) of the invention are not necessarily provided all together, and that the invention may be embodied with selected one or ones of the elements or features described with respect to the same mode.

(1) An electronic-circuit-component supplying method of supplying each of a plurality of electronic circuit components to a predetermined supplying position, by feeding a component tape which includes a carrier tape and the plurality of electronic circuit components held by the carrier tape and arranged in a longitudinal direction of the carrier tape, in the longitudinal direction of the carrier tape, the method including:

a component-tape information reading step of reading, by a component-tape information reading device, component-tape information relating to the component tape and represented by an information medium portion which is provided in the component tape; and an information utilizing step of utilizing the component-tape information read in the component-tape information reading step.

The above-described component-tape information may be a bar code or a two-dimensional code (QR code) which is represented by readable by recognizing the code with a code recognizing device as an optical information reading device, or may be stored in an information medium piece to and from which the information is writable and readable by means of a light such as laser light in the same principle as an optical disc or a magneto-optical disc, or may be stored in an information communication storage chip equipped with a communication portion capable of having communication in a non-contact manner. As the component-tape information reading device, a device suitable for property of information to be read or property of information medium portion storing the information is used.

The component tape may be provided with at least one information medium portion such as a component-tape code or tap chip. However, commonly, it is more convenient that the component tape is provided with a plurality of information medium portions. For example, the plurality of information medium portions may be provided in leading and trailing end portions of the component tape, or may be provided over the entire length of the component tape. In either case, it is preferable that the plurality of information medium portions are provided to be equally spaced apart from each other. Further, commonly, it is more convenient that the plurality of information medium portions are provided on a top surface of the component tape, i.e., one of opposite surfaces of the component tape which is positioned on the upper side of the other surface during supply of the components. However, depending upon the position of the component-tape information reading device such as a component-tape code recognizing device, it is also possible to provide the plurality of information medium portions on a bottom surface of the component tape.

For recognizing the component-tape code provided in the component tape, the component-tape code recognizing device and the component-tape code have to be necessarily opposed to each other. Where the component-tape code and the component-tape code recognizing device are provided by a bar code and a bar code reader, respectively, the bar code can be read by the bar code reader while the component tape is being fed. However, if the bar code is elongated over a large distance, the entirety of the bar code can not be read by the bar code reader in a single feed motion of the component tape. Therefore, even where the component-tape code is provided by the bar code, it is preferable that the bar code reader is arranged to read the bar code while the feeding of the component tape is stopped. Where the component-tape code is provided by a two-dimensional code, too, it is preferable that the code is read while the feeding of the component tape is stopped. For enabling the code to be read while the feeding of the component tape is stopped, it is necessary to assure that the code recognition is done in a state in which the component-tape code recognizing device and the component-tape code are stopped relative to each other and precisely opposed to each other. As one measure for assuring it, there is an arrangement in which the component-tape code is provided in the component tape such that the component-tape code is precisely opposed to the component-tape code recognizing device while one of the electronic circuit components is positioned in the component supplying position by the component tape. In this arrangement, the component-tape code can be reliably recognized by activating the component-tape code recognizing device each time the feeding of the component tape is stopped. If the same number of the component-tape codes as that of the electronic circuit components are provided in the component tape, the component-tape code can be recognized every time any one of the electronic circuit components is positioned in the component supplying position. However, where at least one of the leading and trailing end portions of the component tape is provided with the plurality of component-tape codes such that the component-tape codes are arranged at a spacing pitch that is integer times as large as a spacing pitch at which the electronic circuit components are arranged on the carrier tape, the code recognition can be effectively made with a comparatively small number of the component-tape codes.

As another measure for assuring that the code recognition is done in the state where the component-tape code recognizing device and the component-tape code are stopped relative to each other and precisely opposed to each other, there is an arrangement in which, in addition to the component-tape code recognizing device, a recognition-enabling-condition detecting device is provided to detect a condition which enables recognition of the component-tape code by the component-tape code recognizing device, by confirming that the component-tape code recognizing device and the component-tape code are stationary to be precisely opposed to each other. For example, by detecting a certain portion of the component tape by the recognition-enabling-condition detecting device, it is possible to reliably confirm that the component-tape code recognizing device and the component-tape code are stopped to be precisely opposed to each other. The above-described certain portion may be constituted by a portion which is different (e.g., in material or color) from the other portion of the component tape, so that the certain portion can be easily distinguished from the other portion by the recognition-enabling-condition detecting device. The recognition-enabling-condition detecting device may be provided by, for example, a contact-type sensor such as a contact-type micro switch, or a non-contact-type sensor such as a proximity sensor and an optical sensor. The optical sensor may take the form of, for example, a photoelectric sensor of light-transmission type, a photoelectric sensor of light-reflection type, or a color sensor.

In the information utilizing step, an information generating step described in the below-described mode (2) may be included.

(2) An electronic-circuit-component supplying method according to mode (1), wherein the information utilizing step includes an information generating step of comparing the read component-tape information with predetermined component-tape information, and generating variable information which varies depending upon whether the read component-tape information corresponds to the predetermined component-tape information or not.

For example, as a representative example of the correspondence of the read component-tape information to the predetermined component-tape information, there is a case where an identification code recognized in a component-tape code recognizing step as the component-tape information reading step is identical with a predetermined identification code. However, the recognized identification code does not have to be necessarily identical with the predetermined identification code, as long as the information represented by the recognized identification code corresponds to that represented by the predetermined identification code. For example, one and the other of the two identification codes may be respectively provided by a bar code and a two-dimensional code. Namely, the two identification codes may be different in kind from each other, as long as the content of the information represented by one of the two identification codes is the same as that represented by the other identification code. Further, one and the other of the two identification codes may be provided by an identification code of a storing member and an identification code of the component tape, respectively, as long as the contents of the information represented by the respective two identification codes are the same.

Since the variable information generated in the information generating step varies depending upon whether or not the read component-tape information corresponds to the predetermined component-tape information, an operator can be informed, by the generated information, of a fact that wrong component tape has been erroneously installed on a component supplying device. Further, supply of the components can be stopped in accordance with the generated information.

(3) An electronic-circuit-component supplying method according to mode (1) or (2), including a component-tape code providing step of providing a component-tape code representative of the component-tape information, in the component tape.

If the component-tape code is not provided in the component tape available in the market, the component-tape code may be provided in the component tape by a user of the component tape.

(4) An electronic-circuit-component supplying method according to mode (3), wherein the component-tape-code providing step includes a connecting step of connecting two component tapes such that a trailing end portion of one of the two component tapes and a leading end portion of the other of the two component tapes are connected through a connecting member which is provided with the component-tape code.

The connecting member can serve not only to connect two component tapes but also to carry the component-tape code. Since the connecting member is commonly short, the component-tape code can be provided in the connecting member, easier than in the component tape which is commonly elongated over a large distance. Further, since the component-tape code can be recognized at the leading end portion of the above-described other of the two component tapes, the code recognition can be made in an early stage. The connecting member may be provided by any one of members having various shapes such as a connecting piece which has a relatively large thickness and is difficult to be bent with a small radius of curvature, and a connecting tape which has a relatively small thickness and is easy to be bent with a small radius of curvature. Further, the connecting member may be formed of a metallic material such as steel, copper, brass, SUS and aluminum, or alternatively, a synthetic resin or a paper.

(5) An electronic-circuit-component supplying method according to mode (4), wherein the component-tape code providing step includes a code-carrying connecting-member preparing step of providing the component-tape code in the connecting member.

(6) An electronic-circuit-component supplying method according to mode (5), wherein the connecting member is a connecting tape which is fixed to the trailing end portion of the above-described one of the component tapes and the leading end portion of the other of the component tapes, for connecting the component tapes, and wherein the code-carrying connecting-member preparing step includes a code printing step of printing the component-tape code on the connecting tape.

It is easy to print the component-tape code on the connecting tape, so that the code-carrying connecting member can be prepared by a simple device. The connecting member is fixed to the trailing and leading end portions of the component tapes by, preferably, an adhesive or sticker. However, the connecting member may be otherwise fixed to the component tapes.

(7) An electronic-circuit-component supplying method according to mode (5) or (6), wherein the code-carrying connecting-member preparing step includes a storing-member code recognizing step of recognizing, by a storing-member code recognizing device, a storing-member code provided in a tape storing member which stores the component tape, wherein the connecting member is provided with the component-tape code in the form of an identification code which represents information corresponding to information represented by the storing-member code recognized in the storing-member-code recognizing step.

The storing member may be provided by, for example, a tape reel onto which the component tape is wound, or a tape storing box in which the component tape is stored. The tape storing member is commonly provided with the storing-member code (which commonly corresponds to the component-tape code of the component tape stored in the storing member). Therefore, in the arrangement in which the connecting member is provided with the identification code representing the information that corresponds to the information represented by the recognized storing-member code, the identification code provided in the connecting member can be recognized, as the component-tape code of the component tape, by the component-tape code recognizing device in the component-tape code recognizing step. It is commonly easier to recognize the component-tape code provided in the component tape, than to recognize the storing-member code provided in the tape storing member. Further, where the component tape is provided with the component-tape code prepared in accordance with a result of the recognition of the storing-member code, it is possible to reliably avoid erroneous provision of a wrong component-tape code in the component tape.

(8) An electronic-circuit-component supplying method according to any one of modes (4)-(7), including a comparing step of comparing the component-tape code provided in the connecting member, with the component-tape code provided in the above-described one of the component tapes, wherein the information generating step is a step of generating the information where the component-tape information represented by one of the two compared component-tape codes and the component-tape information represented by the other of the two compared component-tape codes do not correspond to each other.

The "component-tape code provided in the above-described one of the component tapes" may be, for example, a component-tape code provided in the connecting member which had connected this one of the component tapes with the component tape preceding this one of the component tapes, a storing-member code provided in the storing member which had stored this one of the component tapes, or a predetermined component-tape code representative of information corresponding to information to be presented by the component-tape code provided in this one of the component tapes. In any one of these cases, if a wrong component tape had been erroneously connected to the above-described one of the component tapes, the operator can be informed of this fact before initiation of supply of wrong electronic circuit components.

(9) An electronic-circuit-component supplying method of supplying each of a plurality of electronic circuit components to a predetermined supplying position by feeding a component tape which includes a carrier tape and the plurality of electronic circuit components held by the carrier tape and arranged in a longitudinal direction of the carrier tape, in the longitudinal direction of the carrier tape, the method including:

a connecting step of connecting two component tapes such that a trailing end portion of one of the two component tapes and a leading end portion of the other of the two component tapes are connected; and an information generating step of generating variable information which varies depending upon whether component-tape information represented by an information medium portion provided in the above-described one of the component tapes corresponds to component-tape information represented by an information medium portion provided in the above-described other of the component tapes.

The information medium portion representative of component-tape information may be provided in the component tape, by either a maker or user of the component tape. In either case, if a wrong component tape had been erroneously connected to the above-described one of the component tapes, the operator can be informed of this fact by the variable information generated in the information generating step.

(10) An electronic-circuit-component supplying method according to mode (9), wherein each of the above-described one and other of the component tapes is provided with a component-tape code representative of the component-tape information, the method including:

a step of recognizing, by a component-tape code recognizing device, the component-tape code provided in the above-described one of the component tapes; and a step of recognizing, by the above-described component-tape code recognizing device or another component-tape code recognizing device, the component-tape code provided in the above-described other of the component tapes, wherein the information generating step includes a step which is implemented when information represented by the code provided in the above-described one of the component tapes does not correspond to information represented by the code provided in the above-described other of the component tapes, to generate information indicating this fact.

(11) An electronic-circuit-component supplying method according to any one of modes (2)-(10), including an informing step which is implemented at least when the information represented by one of two component-tape codes does not correspond to the information represented by the other of the two component-tape codes, in accordance with the variable information generated in the information generating step, to inform the operator of this fact.

Where the information represented by the above-described one component-tape code does not correspond to the information represented by the other component-tape code, this fact is informed to the operator so that the operator can easily take necessary measures.

(12) An electronic-circuit-component supplying method according to any one of modes (2)-(11), including a supply suspending step which is implemented when the information represented by one of two component-tape codes does not correspond to the information represented by the other of the two component-tape codes, in accordance with the variable information generated in the information generating step, to suspend supply of the electronic circuit components.

Where the information represented by the above-described one component-tape code does not correspond to the information represented by the other component-tape code, the component supply is suspended thereby making it possible to reliably avoid erroneous supply of wrong kind of electronic circuit components.

(13) An electronic-circuit-component supplying method according to any one of modes (1)-(12), wherein the plurality of electronic circuit components of the component tape are respectively accommodated in a plurality of accommodating recess portions formed in the carrier tape and arranged in the longitudinal direction of the carrier tape, and are prevented from being removed from the storing recess portions, by a cover tape attached to the carrier tape.

It is common that the connecting member is provided in each of the carrier tape and the cover tape. Although the information medium portion such as the component-tape code may be provided in at least one of the carrier tape and the cover tape, it is common that the provision of the information medium portion in the cover tape rather than in the carrier tape facilitates the reading of the component-tape information by the component-tape code recognizing device.

(14) An electronic-circuit-component supplying method according to any one of modes (1)-(13), wherein the component-tape information reading device includes an optical reading device which reads, in an optical manner, a component-tape code as the information medium portion.

Although it is also possible to use a magnetic recognizing device or other device as the component-tape information reading device, the optical reading device is preferable in view of the cost and maneuverability.

(15) A component-tape information providing method including:

a storing-member information reading step of reading, by a storing-member information reading device, storing-member information represented by a first information medium portion which is provided in a tape storing member storing a component tape which includes a carrier tape and the plurality of electronic circuit components held by the carrier tape and arranged in a longitudinal direction of the carrier tape; and a component-tape information providing step of providing the component tape with a second information medium portion which represents component-tape information relating to the component tape, wherein the component-tape information corresponds to the storing-member information which is read in the storing-member information reading step.

The storing-member information may be represented by a bar code or a two-dimensional code which is readable by recognizing the code with an optical code recognizing device, or may be stored in an information medium piece to and from which the information is writable and readable by means of a light such as laser light in the same principle as an optical disc or a magneto-optical disc, or may be stored in an information communication storage chip equipped with a communication portion capable of having communication in a non-contact manner. As the component-tape information reading device, a device suitable for property of information to be read or property of information medium portion storing the information is used.

The description with respect to the above mode (7) applies to the present mode. However, in the present mode, the component-tape information does not have to be necessarily represented by a component-tape code, and the second information medium portion representative of the component-tape information does not have to be provided necessarily in the connecting member. The description with respect to the above mode (2) applies to the "correspondence of the component-tape information to the storing-member information" in the present mode. The component tape is provided with the second information medium portion which represents component-tape information corresponding to the storing-member information represented by the first information medium portion provided in the tape storing member, so that the information medium portion representing appropriate information is easily and reliably provided in the component tape.

(16) A component-tape information providing method according to mode (15), wherein the component-tape information providing step includes a step of providing a connecting member with a component-tape code as the second information medium portion which represents the component-tape information that corresponds to the storing-member information represented by a storing member code as the first information medium portion which is recognized in a storing-member code recognizing step as the storing-member information reading step, and a step of connecting two component tapes such that a trailing end portion of one of the two component tapes and a leading end portion of the other of the two component tapes are connected through the connecting member.

The description with respect to the above mode (4) applies to the present mode.

(17) An electronic-circuit-component supplying system comprising:

a tape feeder which supplies each of a plurality of electronic circuit components to a predetermined supplying position, by feeding a component tape which includes a carrier tape and the plurality of electronic circuit components held by the carrier tape and arranged in a longitudinal direction of the carrier tape, in the longitudinal direction of the carrier tape;

a component-tape information reading device which reads component-tape information relating to the component tape and represented by an information medium portion which is provided in the component tape fed by the tape feeder; and an information utilizing device which utilizes the component-tape information read by the component-tape information reading device.

The above-described component-tape information may be represented by a bar code or a two-dimensional code which is readable by recognizing the code with a code recognizing device as an optical information reading device, or may be stored in an information medium piece to and from which the information is writable and readable by means of a light such as laser light in the same principle as an optical disc or a magneto-optical disc, or may be stored in an information communication storage chip equipped with a communication portion capable of having communication in a non-contact manner. As the component-tape information reading device, a device suitable for property of information to be read or property of information medium portion storing the information is used.

(18) An electronic-circuit-component supplying system according to mode (17), wherein the information utilizing device includes an information generating portion which generates variable information which varies depending upon whether the component-tape information read in the component-tape information reading device corresponds to predetermined information or not.

(19) An electronic-circuit-component supplying system according to mode (17) or (18), including a component-tape information providing device which provides the information medium portion in the component tape.

The component-tape code representative of the component-tape information may be attached directly to the component tape, or alternatively, may be attached to a member other than the component tape, for example, a connecting member which connects a trailing end portion of one of two component tapes with a leading end portion of the other of the two component tapes, as described in the following mode.

(20) An electronic-circuit-component supplying system according to mode (19), wherein the component-tape information providing device includes a tape connecting device which connects two component tapes such that a trailing end portion of one of the two component tapes and a leading end portion of the other of the two component tapes are connected through a connecting member which is provided with a component-tape code representative of the component-tape information so that the component-tape code is provided in the connected component tapes.

The description with respect to the above mode (4) applies to the present mode. Where the trailing and leading end portions of the above-described one and other of the two component tapes are connected by a connecting tool, the above-described tape connecting device is constituted by this connecting tool.

(21) An electronic-circuit-component supplying system according to mode (20), including a code-carrying connecting-member preparing device which provides the component-tape code in the connecting member.

(22) An electronic-circuit-component supplying system according to mode (21), wherein the connecting member is a connecting tape which is attached to the trailing and leading end portions of the above-described one and other of the two component tapes, for connecting the two component tapes, and wherein the code-carrying connecting-member preparing device includes a code printing device which prints the component-tape code on the connecting tape.

The description with respect to the above mode (6) applies to the present mode.

(23) An electronic-circuit-component supplying system according to mode (21) or (22), wherein the code-carrying connecting-member preparing device includes:

a storing-member code recognizing device which recognizes a storing-member code provided in a tape storing member storing the component tape; and a connecting-member code providing device which provides the connecting member with the component-tape code in the form of an identification code which represents information corresponding to the storing-member information which is represented by the storing-member code recognized by the storing-member code recognizing device.

The description with respect to the above mode (7) applies to the present mode.

(24) An electronic-circuit-component supplying system according to any one of modes (20)-(23), including a comparing portion which compares the component-tape code provided in the connecting member, with the component-tape code provided in the above-described one of the component tapes, wherein the information generating portion generates the information where the component-tape information represented by one of the two compared component-tape codes and the component-tape information represented by the other of the two compared component-tape codes do not correspond to each other.

The description with respect to the above mode (8) applies to the present mode.

(25) An electronic-circuit-component supplying system according to any one of modes (1 8)-(24), including an informing portion which is operable at least when the information represented by one of two component-tape codes does not correspond to the information represented by the other of the two component-tape codes, in accordance with the variable information generated in the information generating portion, to inform the operator of this fact.

(26) An electronic-circuit-component supplying system according to any one of modes (18)-(25), including a supply suspending portion which is operable when the information represented by one of two component-tape codes does not correspond to the information represented by the other of the two component-tape codes, in accordance with the variable information generated in the information generating step, to suspend supply of the electronic circuit components.

(27) A component-tape code providing system including:

a storing-member information reading portion which reads storing-member information represented by an information medium portion which is provided in a tape storing member storing a component tape which includes a carrier tape and a plurality of electronic circuit components held by the carrier tape and arranged in a longitudinal direction of the carrier tape; and a component-tape code providing portion which provides the component tape with a component-tape code representative of a component-tape information that corresponds to the storing-member information which is read in the storing-member information reading portion.

The feature described in each of the above modes (18)-(26) is applicable also to the component-tape code providing system of the present mode.

(28) A component-tape code providing system according to mode (27), including a code-carrying connecting-member preparing device which provides a connecting member with the component-tape code representative of the component-tape information that corresponds to storing-member information represented by a storing-member code which is recognized by a storing-member code recognizing portion as the storing-member information reading portion, wherein the component-tape code providing portion includes a connecting device which connects two component tapes such that a trailing end portion of one of the two component tapes and a leading end portion of the other of the two component tapes are connected through the connecting member which is prepared by the code-carrying connecting-member preparing device.

(29) An electronic-circuit-component mounting system, including:

a component supplying device which supplies a plurality of electronic circuit components;

a board holding device which holds a circuit board, onto which the electronic circuit components are to be mounted so that the circuit board constitutes an electronic circuit; and a component mounting device which receives the electronic circuit components from the component supplying device, and mounts the electronic circuit components onto the circuit board held by the board holding device, wherein the component supplying device includes a tape feeder which sequentially supplies the electronic circuit components to a predetermined supplying position, by feeding a component tape which includes a carrier tape and the plurality of electronic circuit components held by the carrier tape and arranged in a longitudinal direction of the carrier tape, in the longitudinal direction of the carrier tape, the system further including:

a component-tape information reading device which reads component-tape information relating to the component tape and represented by an information medium portion that is provided in the component tape; and an information generating portion which generates variable information varying depending upon whether the component-tape information read by the component-tape information reading device corresponds to predetermined information or not.

The above-described component-tape information may be represented by a bar code or a two-dimensional code which is readable by recognizing the code with a code recognizing device as an optical information reading device, or may be stored in an information medium piece to and from which the information is writable and readable by means of a light such as laser light in the same principle as an optical disc or a magneto-optical disc, or may be stored in an information communication storage chip equipped with a communication portion capable of having communication in a non-contact manner. As the component-tape information reading device, a device suitable for property of information to be read or property of information medium portion storing the information is used. The description with respect to the above mode (2) applies to the present mode.

(30) An electronic-circuit-component mounting system according to mode (29), includes a component-tape information providing device which provides the component tape with the information medium portion representative of the component-tape information.

(31) An electronic-circuit-component mounting system according to mode (30), wherein the component-tape information providing device includes a tape connecting device which connects two component tapes such that a trailing end portion of one of the two component tapes and a leading end portion of the other of the two component tapes are connected through a connecting member which is provided with the component-tape code so that the component-tape code is provided in the connected component tapes.

(32) An electronic-circuit-component mounting system according to mode (31), including:

a storing-member information reading device which is provided by the component-tape information reading device or another device and which reads a storing-member information represented by an information medium portion that is provided in a tape storing member storing the component tape; and an information-carrying connecting-member preparing device which provides the connecting member with an information medium portion representative of information, as the component-tape information, corresponding to the storing-member information read by the storing-member information reading device.

The feature described in each of the above modes (22), (24)-(26) is applicable also to the electronic-circuit-component mounting system of the present mode.

(41) A component-tape connecting member for connecting a leading end portion of a component tape and a trailing end portion of another component supplying tape, each of the component tapes including a carrier tape and a plurality of electronic circuit components arranged on and held by the carrier tape, and being to be fed in a longitudinal direction thereof for sequentially positioning the electronic circuit components in a component supplying position, the connecting member including an information medium portion which enables information to be writable to and readable from the information medium portion.

The connecting member can serve not only to connect two component tapes but also to store information. Since the connecting member is shorter than the entirety of the component supplying tape, the information can be easily stored in the connecting member. The connecting member may be provided by any one of members having various shapes such as a connecting piece which has a relatively large thickness and is difficult to be bent with a small radius of curvature, and a connecting tape which has a relatively small thickness and is easy to be bent with a small radius of curvature. Further, the connecting member may be formed of a metallic material such as steel, copper, brass, SUS and aluminum, or alternatively, a synthetic resin or a paper.

(42) A component-tape connecting member according to mode (41), wherein the information medium portion enables the information to be writable to and readable from the information recording portion, in a non-contact manner, namely, without the information medium portion being brought into contact with a device which writes and reads the information to and from the information medium portion.

In the component-tape connecting member of the present mode, the information medium portion includes an information medium piece to and from which the information is writable and readable by means of a light such as laser light in the same principle as an optical disc or a magneto-optical disc, or includes an information communication storage chip described in the following mode.

(43) A component-tape connecting member according to mode (42), wherein the information medium portion includes an information communication storage chip which is fixed to the connecting member and which has a communication portion capable of having communication in a non-contact manner.

The information communication storage chip, which is commonly known as an electronic tag, is one example of the information medium portion. Generally, the electronic tag has a memory for storing information, a communication circuit and a logical circuit which communicates the memory and the communication circuit, and is capable of storing large volume of information. The electronic tag has an integrated or detachable antenna, for having communication with an information receiving device so as to transmit the information to the information receiving device. The electronic tag can be referred also to as radio tag, non-contact tag and IC (integrated circuit) with communication function. The electronic tag mainly has features that (A) it is capable of at least transmitting information in a non-contact manner, and that (B) it communicates with an information receiving device through a medium in the form of radio wave or electromagnetic wave (including a light). Further, the electronic tag commonly has features that (C) it is capable of communicating with an information receiving device even in presence of an obstacle (except a metal) between the tag and the information receiving device, that (D) its data storage has a large capacity, and that (E) content of stored data is rewritable.

As the electronic tag, there is an electronic tag from and to which information is readable and writable. Further, there are an electronic tag having a microprocessor incorporated therein, and an electronic tag having a sensor incorporated therein such as temperature sensor and pressure sensor.

The electronic tag is classified, from a standpoint of principle of the transmission of information, into several types which include an electrostatic coupling type, an electromagnetic coupling type, an electromagnetic induction type, a microwave type and an optical type. A communication distance of the electronic tag varies depending upon the principle of the transmission. By selecting a suitable principle of transmission, the communication distance can be adjusted with a range between several millimeters and several meters.

Further, as the electronic tag, there are electronic tags having different shapes such as label-like, tubular, coin-like, card-like, box-like, stick-like and grain-like shapes, and different sizes ranging from a value smaller than one millimeter, to a value of several tens of millimeters.

Therefore, the electronic tag is suitable for serving as the information medium portion which is provided in the connecting member or other small-sized element having a limitation in space available for the provision of the information medium portion. Where the information medium portion is given a sheet-like shape such as a label-like shape, or is given a grain-like shape or otherwise considerably small-sized shape, such an information medium portion is easily provided in the connecting member. Further, since the information is transmitted from the electronic tag to the information receiving device by a radio communication, the transmission of the information can be made without the information receiving device being precisely opposed to the electronic tag, in a length of time that is shorter than where the bar code is used. Where the information represented by the bar code is intended to be read by the bar code reader, the bar code and the bar code reader have to be precisely opposed to each other, thereby requiring a complicated arrangement or a large length of time for reading the information. The use of the electronic tag avoids occurrence of such an inconvenience.

(44) A component-tape connecting member according to any one of modes (41)-(43), wherein the information medium portion stores information relating to the electronic circuit components which are held by the carrier tape of the component tape.

The information medium portion stores the information relating to the electronic circuit components such as data elements indicative of kind and number of the components, so that the information can be utilized in various operations dealing with the components.

(45) A component-tape connecting member according to mode (44), wherein the information relating to the electronic circuit components includes at least an identification data of the electronic circuit components held by the carrier tape of the component tape.

(46) A component-tape connecting member according to mode (44) or (45), wherein the information relating to the electronic circuit components includes at least a data indicative of number of the electronic circuit components held by the carrier tape of the component tape.

(47) A component-tape connecting member according to any one of modes (41)-(46), being a connecting tape.

(50) A connecting-member supplying device for supplying a connecting member which connects a leading end portion of a component tape and a trailing end portion of another component tape, each of the component tapes including a carrier tape and a plurality of electronic circuit components arranged on and held by the carrier tape, and being to be fed in a longitudinal direction thereof for sequentially positioning the electronic circuit components in a component supplying position, the connecting-member supplying device including:

an information reading and supplying device which reads, from a storing-member-information medium portion, information relating to the component tape, and which supplies the information, the storing-member-information medium portion being provided in a tape storing member which stores the component tape such that the component tape can be taken out of the tape storing member, with the leading end portion being first pulled out of the tape storing member;

an information writing device which writes at least a part of the information supplied from the information reading and supplying device, to a connecting-member information medium portion provided in a connecting member, such that the written part of the information is readable from the connecting-member information medium portion, the connecting member connecting the leading end portion of the component tape stored in the tape storing member, with the trailing end portion of the above-described another component tape; and a supplying portion which holds the connecting member, and allows supply of the connecting member after the part of the information is written to the connecting-member information medium portion by the information writing device.

The supplying portion preferably has a connecting-member holding device which is arranged to hold the connecting member at least while the information is being written to the connecting-member information medium portion of the connecting member. Where the connecting-member holding device is arranged to allow supply of the connecting member when the connecting member is positioned in an information writing position, the supplying portion does not have to be equipped with any device other than the connecting-member holding device. However, where it is difficult or impossible to take out the connecting member directly from the information writing position, the supplying portion is equipped with a connecting-member feeding device for feeding the connecting member to a position which facilitates the connecting member to be taken out from the connecting-member supplying device. Further, the connecting member may be set on the connecting-member holding device by an operator or robot, or may be fed from a connecting-member storing device capable of storing a plurality of connecting members, to the information writing position by the connecting-member feeding device. In the latter arrangement, the connecting member can be efficiently set in the information writing position by a relatively simple mechanism. The connecting-member feeding device in the latter arrangement may be adapted to further feed the connecting member to a supplying position after having fed the connecting member to the information writing position.

The feature described in each of the above modes (42)-(47) is applicable to the connecting-member supplying device of the present mode.

(51) A connecting-member supplying device according to mode (50), wherein the supplying portion includes a connecting-member feeding device which feeds the connecting member out from the connecting-member supplying device, after the information is written to the information medium portion of the connecting member.

(52) A connecting-member supplying device according to mode (51), including a connecting-member storing portion which stores a plurality of connecting members, wherein the connecting-member feeding device sequentially feeds, one by one, the connecting members stored in the connecting-member storing portion, via the information writing device.

The connecting member can be formed of a metallic material, too. In such a case, the connecting-member storing portion can be arranged to store a plurality of connecting members independent of each other, and feed sequentially the connecting members one by one. The connecting-member storing portion can be thus arranged, also where the connecting member is provided by a connecting tape. However, where the connecting member is provided by the connecting tape, it is preferable that the plurality of connecting members are arranged in a line and held by a holding tape, and that the holding tape is stored in the connecting-member storing portion. In this arrangement, it is preferable to arrange the connecting-member feeding device to feed the holding tape holding the connecting members, such that the connecting tapes are sequentially fed to the information writing position, or further fed to the supplying position if needed.

(60) An electronic-circuit-component supplying system including:

a tape feeder which includes (a) a storing-member holding portion holding a tape storing member storing a component tape which includes a carrier tape and a plurality of electronic circuit components arranged on and held by the carrier tape, and (b) a feeding device feeding the component tape in a longitudinal direction of the component tape, by taking the component tape out of the tape storing member, such that a leading end portion of the tape is first pulled out of the tape storing member, whereby the electronic circuit components are sequentially positioned in a component supplying position;

an information reading and supplying device which reads, from a storing-member-information medium portion provided in the tape storing member, information relating to the component tape, and which supplies the information;

an information writing device which writes at least a part of the information supplied from the information reading and supplying device, to a connecting-member information medium portion provided in a connecting member, such that the written part of the information is readable from the connecting-member information medium portion, the connecting member connecting the leading end portion of the component tape stored in the tape storing member, with a trailing end portion of another component tape which is being fed by the feeding device; and a supplying portion which holds the connecting member, and allows supply of the connecting member after the part of the information is written to the connecting-member information medium portion by the information writing device.

The tape storing member may be provided, for example, by a tape reel on which the component tape is wound, or a tape storing box in which the component tape is stored. It is common that the storing-member-information medium portion of the tape storing member stores the information relating to the electronic circuit components held by the component tape which is stored in the tape storing member. Therefore, in the arrangement in which at least a part of the information read by and supplied from the reading and supplying device is readably written by the information writing device to the connecting-member information medium portion, the information read from the connecting-member information medium portion can be utilized in various operations carried out in the electronic-circuit-component supplying system. It is commonly easier to read the information from the information medium portion provided in the connecting member, than to read the information from the information medium portion provided in the tape storing member. For example, where the tape storing member is provided by a tape reel, it is common that the storing-member information medium portion is provided on a side face of the tape reel. Thus, it is difficult to the read the information from the storing-member information medium portion, where the plurality of tape storing members each held by the storing-member holding portion are positioned to be close to each other. However, the information stored in the connecting-member information medium portion can be read, for example, from a position above or below the connecting member. Further, in the arrangement in which the information stored in the storing-member information medium portion is written to the connecting-member information medium portion, the information relating to the electronic circuit components held by the component supplying tape stored in the tape storing member can be easily written to the connecting-member information medium portion, and different information is prevented from being erroneously written to the connecting-member information medium portion. It is commonly easier to read the information from the information medium portion provided in the connecting member, than to read the information from the information medium portion provided in the tape storing member. For example, where the tape storing member is provided by a tape reel, it is common that the storing-member information medium portion is provided on a side face of the tape reel. Thus, it is difficult to the read the information from the storing-member information medium portion, where the plurality of tape storing members each held by the storing-member holding portion are positioned to be close to each other. However, the information stored in the connecting-member information medium portion can be read, for example, from a position above or below the connecting member. Further, in the arrangement in which the information stored in the storing-member information medium portion is written to the connecting-member information medium portion, the information relating to the electronic circuit components held by the component supplying tape stored in the tape storing member can be easily written to the connecting-member information medium portion, and different information is prevented from being erroneously written to the connecting-member information medium portion.

The feature described in each of the above modes (42)-(47) is applicable to the electronic-circuit-component supplying system of the present mode.

(61) An electronic-circuit-component supplying device according to mode (60), wherein the supplying portion includes a connecting-member feeding device which feeds the connecting member out from the connecting-member supplying device, after the information is written to the information medium portion of the connecting member.

(62) An electronic-circuit-component supplying device according to mode (61), including a connecting-member storing portion which stores a plurality of connecting members, wherein the connecting-member feeding device sequentially feeds, one by one, the connecting members stored in the connecting-member storing portion, via the information writing device.

(63) An electronic-circuit-component supplying system according to any one of modes (60)-(62), including:

a connecting-member information reading device which is disposed in the vicinity of feed path of the component tape and which reads the written part of the information from the connecting-member information medium portion; and a different-information generating portion operable when the part of the information read by the connecting-member information reading device is different from predetermined information, to generate information indicating that the read information is different from the predetermined information.

When the different-information generating portion generates the different information, it is possible to arrange the system to stop supply of the electronic circuit components in accordance with the different information, as in the following mode of the invention. However, this arrangement is not essential. For example, upon generation of the different information, it is also possible to inform the operator with an alarm. In this case, the operator can decide to stop the supply of the components in accordance with the alarm, or to continue the supply of the components.

(64) An electronic-circuit-component supplying system according to mode (63), stopping supply of the electronic circuit components in accordance with the information which is generated by the different-information generating portion and which indicates that the read information is different from the predetermined information.

Where the present electronic circuit component supplying system is used as a part of electronic circuit component mounting system for assembling an electronic circuit by mounting the electronic circuit components onto a circuit board such as a printed-wiring board, it is possible to prevent unexpected electronic circuit components from being mounted on the circuit board, thereby avoiding fabrication of defective electronic circuit.

(70) An electronic-circuit-component mounting system, including:

a board holding device which holds a circuit board such as a printed-wiring board;

a tape feeder which positions each of a plurality of electronic circuit components in a predetermined component supplying position, by feeding a component tape which includes a carrier tape and the plurality of electronic circuit components arranged on and held by the carrier tape, in a longitudinal direction of the carrier tape;

a mounting device which receives the electronic circuit components positioned in the component supplying position by the tape feeder, and mounts the electronic circuit components onto the circuit board held by the board holding device;

a tape information reading device which is disposed in the vicinity of feed path of the component tape and which reads information from a tape information medium portion provided in the component tape; and a different-information generating portion operable when the information read by the tape information reading device is different from predetermined information, to generate information indicating that the read information is different from the predetermined information.

Although the tape information medium portion in the present mode may include a connecting-member information medium portion defined in the following mode, the tape information medium does not necessarily have to include the connecting-member information medium portion. For example, the tape information medium portion may be provided in the leading end portion of the component tape, by either a maker or user of the electronic circuit components, before the component tape is connected to the preceding component tape. The tape information medium portion preferably includes at least one of a bar code, a two-dimensional code, an information medium piece to and from which the information is writable and readable by means of a light such as laser light in the same principle as an optical disc or a magneto-optical disc, and an information communication storage chip. The tape information reading device defined in the present mode may be interpreted to include the component-tape information reading device defined in the above-described mode (29). The information generating portion defined in the above-described mode (29) may be interpreted to include the different-information generating portion defined in the present mode.

(71) An electronic-circuit-component mounting system according to mode (70), wherein the tape feeder feeds connected component tapes which are constituted by connection of a trailing end portion of a preceding component tape and a leading end portion of a following component tape through a connecting member, and wherein the tape information reading device includes a connecting-member information reading device which reads information from a connecting-member information medium portion provided in the connecting member.

The feature described in each of the above modes (41)-(47) is applicable to the electronic-circuit-component mounting system of the present mode.

(72) An electronic-circuit-component mounting system according to mode (70) or (71), wherein the different-information generating portion has:

a predetermined-information storing portion which stores the predetermined information; and a determining portion which makes a determination as to whether or not the information read by the tape information reading device corresponds to the predetermined information stored in the predetermined-information storing portion, the different-information generating portion generating the information indicating that the read information is different from the predetermined information, when a negative decision is obtained in the above-described determination made by the determining portion.

The predetermined-information storing portion may be provided by a portion storing identification information of electronic circuit components which are expected to be mounted onto a circuit board in an electronic-circuit-component mounting program. However, the predetermined-information storing portion may be provided by a portion of the mounting program per se which portion stores the identification information of the electronic circuit components. Further, the predetermined information may be provided by information which is read from the connecting-member information medium portion when the preceding component supplying tape is connected to a component supplying tape preceding this preceding component supplying tape.

The predetermined-information storing portion may be provided by a portion storing identification information of electronic circuit components which are expected to be mounted onto a circuit board in an electronic-circuit-component mounting program. However, the predetermined-information storing portion may be provided by a portion of the mounting program per se which portion stores the identification information of the electronic circuit components. Further, the predetermined information may be provided by information which is read from the connecting-member information medium portion when the preceding component tape is connected to a component tape preceding this preceding component tape.

(73) An electronic-circuit-component mounting system according to mode (70), wherein the tape feeder which feeds connected component tapes which are constituted by connection of a trailing end portion of a preceding component tape and a leading end portion of a following component tape through a connecting member, and wherein the tape information reading device includes a connecting-member information reading device which reads information from a connecting-member information medium portion provided in the connecting member, and wherein the different-information generating portion includes:

a preceding-component information storing portion which stores information relating to the electronic circuit components held by the preceding component tape; and a determining portion which makes a determination as to whether or not the information read by the connecting-member information reading device corresponds to the information stored in the predetermined-information storing portion, the different-information generating portion generating the information indicating that the read information is different from the predetermined information, when a negative decision is obtained in the above-described determination made by the determining portion.

(74) An electronic-circuit-component mounting system according to any one of modes (70)-(73), including:

an information reading and supplying device which reads, from a storing-member-information medium portion, information relating to the electronic circuit components, and which supplies the information, the storing-member-information medium portion being provided in a tape storing member which stores the component tape such that the component tape can be taken out of the tape storing member, with the leading end portion being first pulled out of the tape storing member;

an information writing device which writes at least a part of the information supplied from the information reading and supplying device, to the connecting-member information medium portion; and a supplying portion which holds the connecting member, and allows supply of the connecting member after the part of the information is written to the information medium portion by the information writing device.

(75) An electronic-circuit-component mounting system according to mode (74), wherein the supplying portion includes a connecting-member feeding device which feeds the connecting member out from the connecting-member supplying device, after the information is written to the information medium portion of the connecting member.

(76) An electronic-circuit-component mounting system according to mode (75), including a connecting-member storing portion which stores a plurality of connecting members, wherein the connecting-member feeding device sequentially feeds, one by one, the connecting members stored in the connecting-member storing portion, via the information writing device.

(80) An electronic-circuit-component mounting system including:

a board holding device which holds a circuit board;

a tape feeder which includes storing-member holding portion holding a tape storing member storing a component tape which includes a carrier tape and a plurality of electronic circuit components arranged on and held by the carner tape, and a tape feeding device feeding the component tape in a longitudinal direction of the component tape, by taking the component tape out of the tape storing member, such that a leading end portion of the tape is first pulled out of the tape storing member, whereby the electronic circuit components are sequentially positioned in a component supplying position;

an information reading and supplying device which reads, from a storing-member-information medium portion provided in the tape storing member, information relating to the component tape, and which supplies the information;

an information writing device which writes at least a part of the information supplied from the information reading and supplying device, to a connecting-member information medium portion provided in a connecting member, such that the written part of the information is readable from the connecting-member information medium portion, the connecting member connecting a leading end portion of the component tape stored in the tape storing member, with a trailing end portion of another component tape which is being fed by the tape feeding device;

a supplying portion which holds the connecting member, and allows supply of the connecting member after the part of the information is written to the connecting-member information medium portion by the information writing device;

a mounting device which receives the electronic circuit components from the tape feeder, and mounts the electronic circuit components onto the circuit board held by the board holding device;

a connecting-member information reading device which is disposed in the vicinity of feed path of the component tape and which is operable upon approximation of the connecting member to the reading device, to read the written part of the information from the connecting-member information medium portion; and a different-information generating portion operable when the part of the information read by the connecting-member information reading device is different from predetermined information, to generate information indicating that the read information is different from the predetermined information.

The feature described in each of the above modes (41)-(47) is applicable to the electronic-circuit-component mounting system of the present mode.

(81) An electronic-circuit-component mounting system according to mode (80), wherein the supplying portion includes a connecting-member feeding device which feeds the connecting member out from the connecting-member supplying device, after the information is written to the information medium portion of the connecting member.

(82) An electronic-circuit-component mounting system according to mode (81), including a connecting-member storing portion which stores a plurality of connecting members, wherein the connecting-member feeding device sequentially feeds, one by one, the connecting members stored in the connecting-member storing portion, via the information writing device.

(90) A component-tape information providing method of providing information relating to one of two component tapes each including a carrier tape and a plurality of electronic circuit components arranged and held on and by the component tape, in a connecting member which connects a leading end portion of the one of the two component tapes with a trailing end portion of the other of the two component tapes that precedes the one of the two component tapes, so that supply of the electronic circuit components through the preceding component tape is followed by supply of the electronic circuit components through the following component tape, the method by including:

an information reading step of reading the information from a storing-member information medium portion which has the information stored therein and which is provided in a tape storing member storing the following component tape; and an information writing step of writing at least a part of the read information, to a connecting-member information medium portion provided in the connecting member, such that the written part of the information is readable from the connecting-member information medium portion.

The description with respect to the above mode (60) applies to the present mode. The feature described in each of the above-described modes defining the systems or devices is applicable to the method of the present mode.

(100) An electronic-circuit-component supplying method of feeding a plurality of component tapes each including a carrier tape and a plurality of electronic circuit components arranged on and held by the carrier tape, in a longitudinal direction of the component tapes, for sequentially positioning the electronic circuit components in a component supplying position so as to supply the electronic circuit components, the method including:

a component supplying step of supplying the electronic circuit components through a preceding component tape which is one of the plurality of component tapes;

a first information reading step of reading, at latest before completion of supply of the electronic circuit components through the preceding component tape, information relating to another of the plurality of component tapes which follows the preceding component tape, from a storing-member information medium portion provided in a tape storing member which stores the above-described another of the plurality of component tapes;

an information writing step of writing at least a part of the read information, to a connecting-member information medium portion provided in a connecting member, such that the written part of the information is readable from the connecting-member information medium portion;

a tape connecting step of connecting a leading end portion of the above-described another of the plurality of component tapes, to a trailing end portion of the preceding component tape, through the connecting member provided with the connecting-member information medium portion to which the above-described at least part of the information has been written;

a second information reading step of reading the above-described at least part of the information written to the connecting-member information medium portion of the connecting member, when the connecting member reaches a predetermined position in step of the supply of the electronic circuit components through the preceding component tape; and a switch allowing/inhibiting step of allowing, if the read information corresponds to a predetermined information, switch from the supply of the electronic circuit components through the preceding component tape, to supply of the electronic circuit components through the above-described another of the component tapes, while inhibiting the switch if the read information is different from the predetermined information.

In the present mode of the invention, the supply of the electronic circuit components through the above-described another component tape is inhibited if the read information is different from the predetermined information, so that supply of unexpected electronic circuit components can be prevented. The feature described in each of the above-described modes defining the systems or devices is applicable to the method of the present mode.

DETAILED DESCRIPTION OF THE PREFERRED EMBODIMENTS

Figure 1:
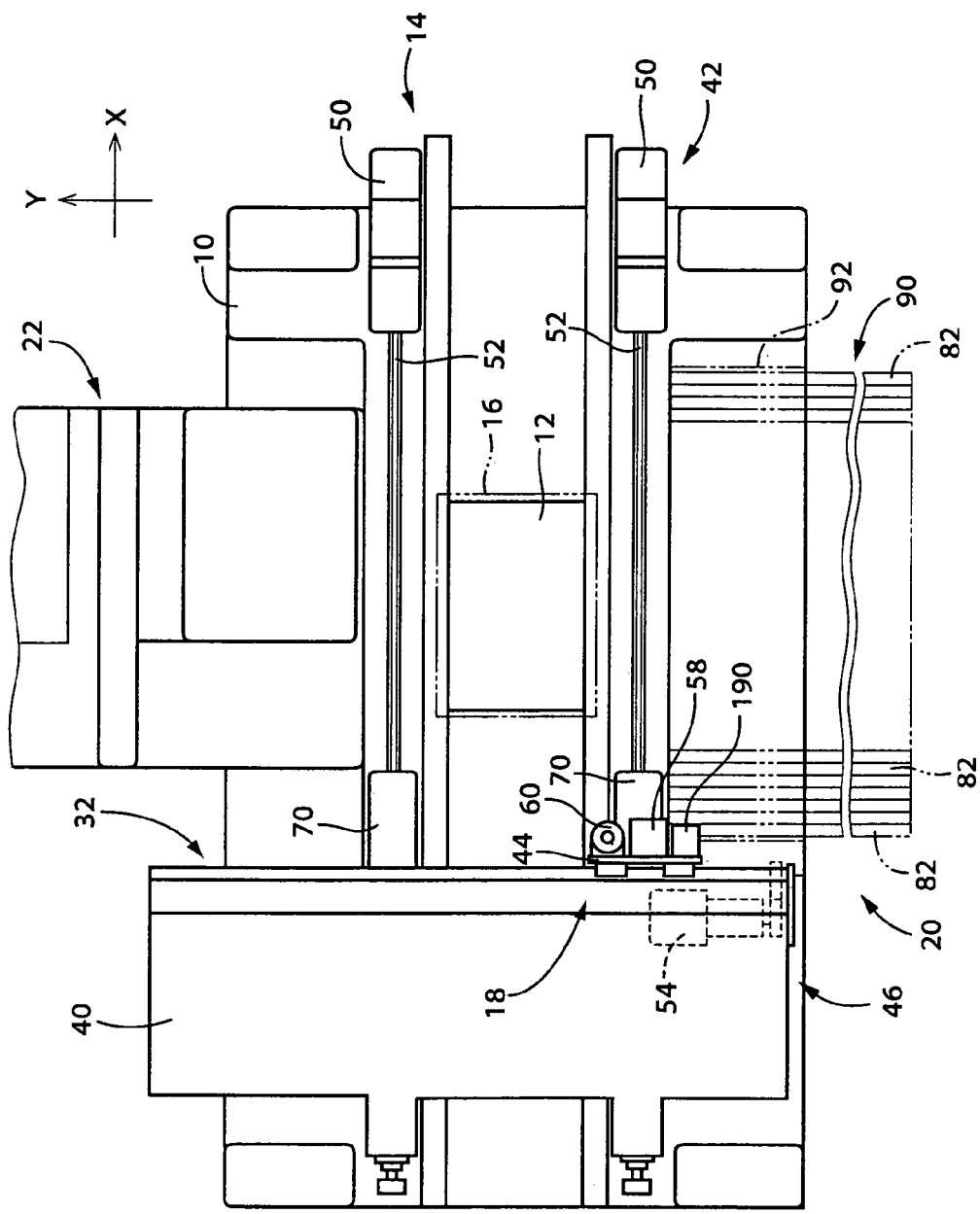
FIG. 1 is a plan view schematically showing an electronic-circuit-component mounting system which is an embodiment of the present invention.

The embodiments of the present invention will be described in detail, referring to the drawings.

FIG. 1 schematically shows an electronic-circuit-component mounting system which is one embodiment of the present invention. Reference numeral 10 denotes a bed of the present electronic-circuit-component mounting system. On the bed 10, there are provided a wiring-board conveyor 14, a board holding device in the form of a printed-wiring-board holding device 16, a component mounting device 18 and component supplying devices 20, 22. The wiring-board conveyor 14 is provided for carrying a circuit board in the form of a printed-wiring board 12, in X-axis direction (in right and left direction as seen in FIG. 1). The component mounting device 18 takes electronic circuit components out of the component supplying devices 20, 22, and then mounts the components onto the printed-wiring board 12 held by the printed-wiring-board holding device 16, so that an electronic circuit is constituted by the board 12 having the components mounted thereon.

In the present embodiment, the printed-wiring board 12 is carried by the wiring-board conveyor 14, while keeping its horizontal posture. The printed-wiring board 12 is then stopped by a stopping device (not shown), so as to be positioned in a predetermined component mounting position. The stopped board 12 is held by the printed-wiring-board holding device 16 provided in a portion of the bed 10 which portion corresponds to the component mounting position, while keeping such a posture that makes its surface parallel to a horizontal plane.

Figure 2:
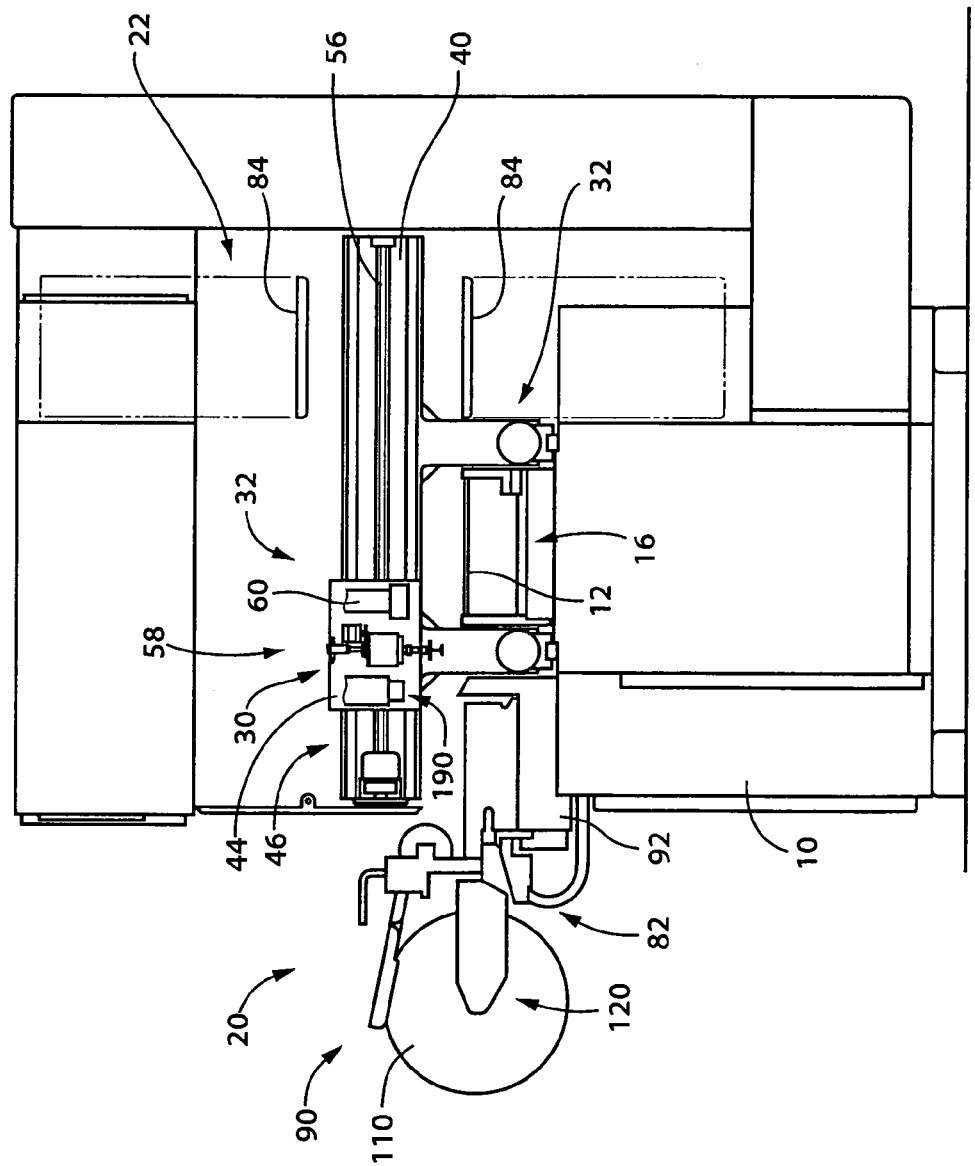
FIG. 2 is a front view of the above-described electronic-circuit-component mounting system.

The component mounting device 18 will be described. In the component mounting device 18, a component holding device 30 (see FIG. 2) is linearly moved by a component-holding-device moving device 32 in a direction having components of the mutually perpendicular X-axis and Y-axis directions, so as to carry an electronic circuit component 34 (hereinafter simply referred to as component 34), and then mount it onto a mounting surface or an upper surface of the printed-wiring board 12. As shown in FIGS. 1 and 2, the component-holding-device moving device 32 is equipped with an X-axis slide 40, a X-axis slide drive device 42, a Y-axis slide 44 disposed on the X-axis slide 40, and a Y-axis slide drive device 46. The X-axis slide drive device 42 is equipped with a drive source in the form of a X-axis slide drive motor 50 and a motion converting device in the form of a ballscrew 52 and a nut (not shown), for thereby moving the X-axis slide 40 in the X-axis direction. The Y-axis slide drive device 46 is equipped with a drive source in the form of a Y-axis slide drive motor 54 and a motion converting device in the form of a ballscrew 56 and a nut (not shown), for thereby moving the Y-axis slide 44 in the Y-axis direction.

The component holding device 30 is disposed on the Y-axis slide 44, and is moved to a desired position on a horizontal plane which is parallel with the surface of the printed-wiring board 12. On the Y-axis slide 44, there are provided the component holding device 30, a component-holding-device elevating device (not shown) for elevating and lowering the component holding device 30, and a component-holding-device rotating device for rotating the component holding device 30 about its axis. These devices provided on the Y-axis slide 44 constitute a component mounting unit 58. Since the component mounting unit 58 in the present embodiment has a construction similar to that of a component mounting unit disclosed in JP-A-H04-372199, the description is not provided.

On the Y-axis slide 44, there are also provided a fiducial-mark camera 60 and an illuminating device (not shown). The fiducial-mark camera 60 constitutes an image taking device for taking images of fiducial marks provided on the printed-wiring board 12. The illuminating device is activated when the images of the fiducial marks are taken, for illuminating the fiducial marks and their periphery.

On the X-axis slide 40, there are unmovably provided component-image taking systems 70, one of which is positioned between the component supplying device 20 and the printed-wiring board 12, and the other of which is positioned between the component supplying device 22 and the printed-wiring board 12. Each of the component-image taking systems 70 has a construction similar to that of a component-image taking system disclosed in JP-A-2001-223500. Although the detailed illustration is not provided, each of the component-image taking systems 70 is equipped with a component camera 72 (see FIG. 9) provided by a CCD camera, a light guide device and an illuminating device, and serves to take a projection image or a front image of each component 34.

The component supplying devices 20, 22 are fixedly positioned on respective opposite sides of the wiring-board conveyor 14 such that the devices 20, 22 are spaced apart from each other in the Y-axis direction that is perpendicular to the X-axis direction on a horizontal plane. One 20 of the two component supplying devices 20, 22 is a feeder-type component supplying device, and has a tape feeder 82 (hereinafter simply referred to as "feeder 82") for supplying the components 34, while the other 22 is a tray-type component supplying device. The tray-type component supplying device 22 includes a tray 84 having a multiplicity of accommodating recess portions formed therein, and is arranged to supply each component 34 which is accommodated in a corresponding one of the accommodating recess portions.

The component supplying device 20 is equipped with a component supplying table 90. The component supplying table 90, which is fixedly disposed in a predetermined position, is equipped with a feeder support base 92 and the plurality of feeders 82 removably attached to the feeder support base 92. The feeder support base 92 is a fixed base. The plurality of feeders 82, each of which holds the components 34 taking the form of component tape 100, are mounted on the feeder support base 92 such that their respective supplying portions (supplying positions) are arranged in the X-axis direction. It is noted that the plurality of feeders may be disposed on respective pallets such that each feeder can be removably attached, together with the corresponding pallet, to the support base.

Figure 4:
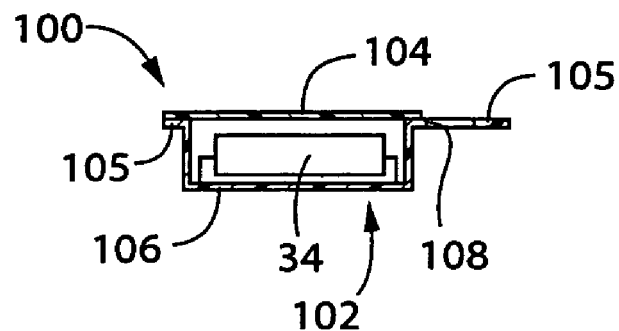
FIG. 4 is a side cross sectional view showing a component tape supplied by the above-described tape feeder.
Figure 5:
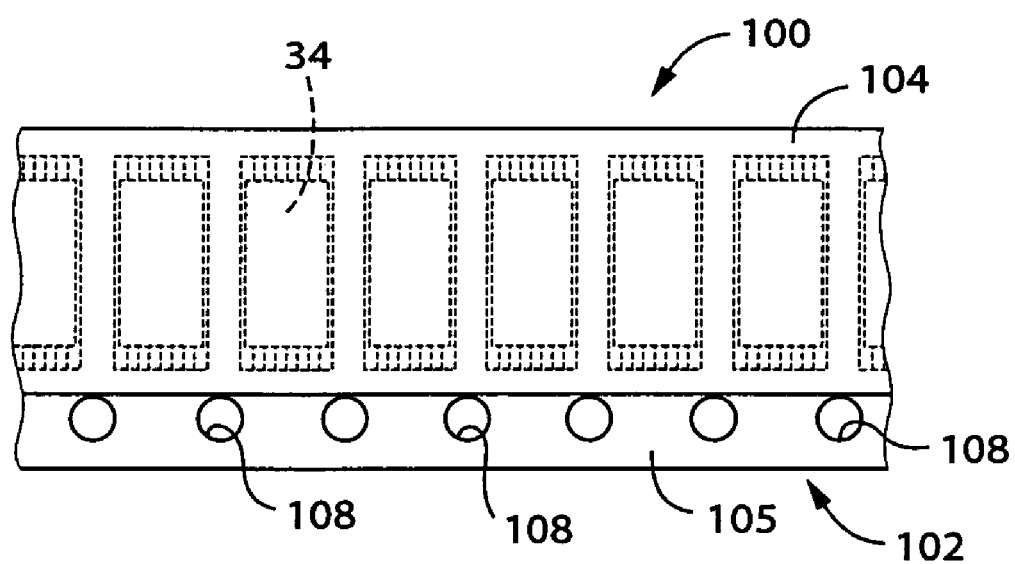
FIG. 5 is a plan view of the above-described component tape.

The components 34, supplied by each feeder 82, takes the form of the component tape (component supplying tape) 100, as shown in FIGS. 4 and 5. The component tape 100 includes the components 34, a carrier tape 102 and a cover tape 104. The carrier tape 102 includes supported portions 105 each of which is provided by a corresponding one of its widthwise opposite end portions and extends in its longitudinal direction, and a plurality of accommodating recess portions 106 (embosses) each of which is located between the supported portions 105 and projects downwardly from the supported portions 105. The accommodating recess portions 106 are arranged at a constant spacing pitch in the longitudinal direction. Each of the accommodating recess portions 106 accommodates a single component 34, and openings of the recess portions 106 are closed by the cover tape 104 for preventing jump of each component 34 out of the corresponding recess portion 106. One of the supported portions 105 has a plurality of feed holes 108 formed therein at a constant spacing pitch, so that the component tape 100 can be fed by a feeding device as described below. The carrier tape 102 and the cover tape 104 are made of a synthetic resin in the present embodiment.

While the component tape 100 is of an emboss type in the present embodiment, it may be a punch-carrier-type tape. The punch-carrier-type tape includes a base tape made of a paper or other material. The base tape has a plurality of through-holes formed through its thickness, and bottom openings of the through-holes are closed by a bottom cover tape, for thereby providing a plurality of accommodating recess portions each of which accommodates a single component 34. Upper openings of the recess portions are closed by a cover tape which is bonded to the base tape. In this punch-carrier-type tape, the base tape and the bottom cover tape constitute the carrier tape.

Figure 10:
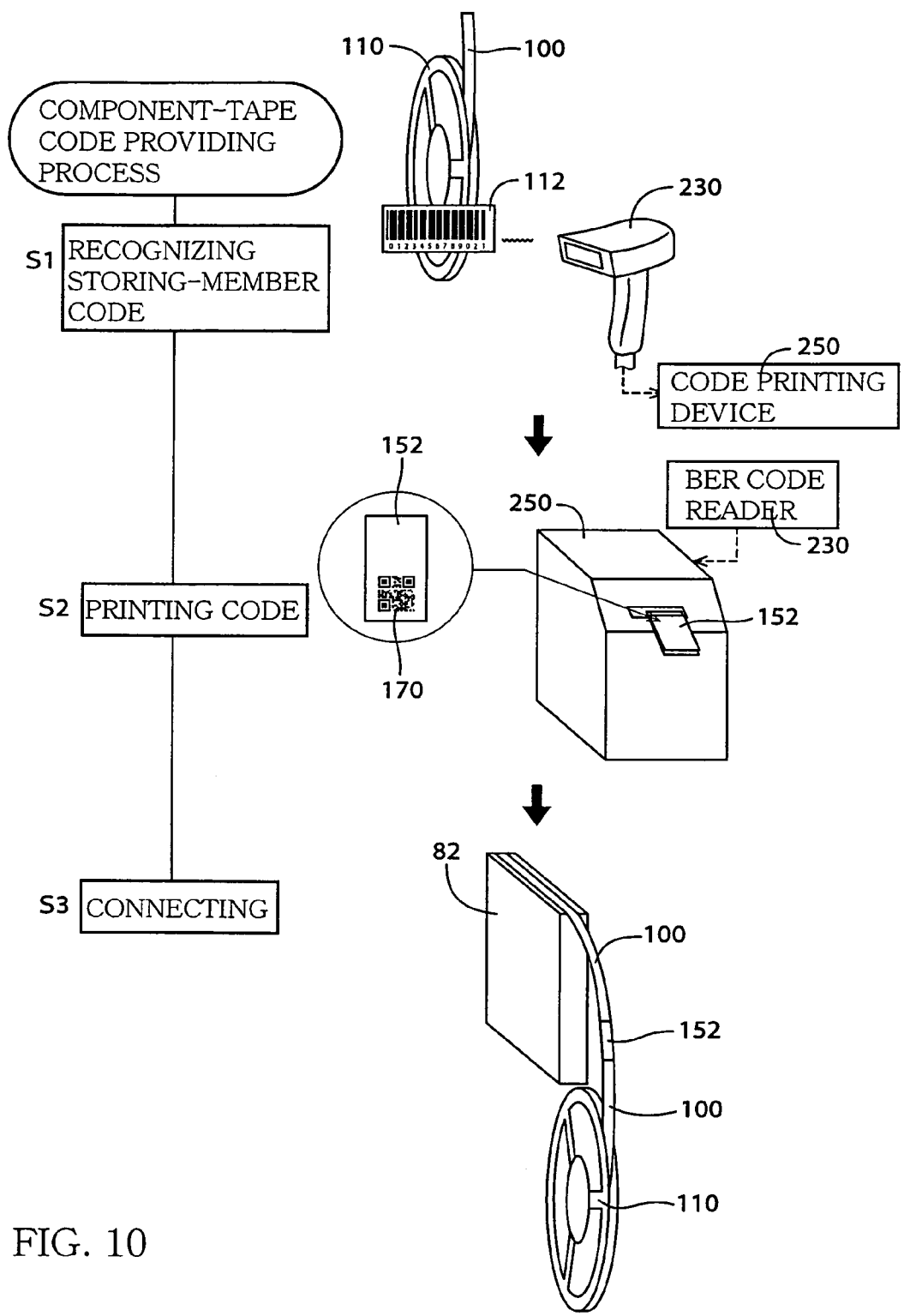
FIG. 10 is a view for explaining a component-tape code providing process of providing a component-tape code in the connecting member which connects the above-described two component tapes.

In the present embodiment, the component tape 100 is wound onto a reel 110 as a tape storing member, as shown in FIGS. 2 and 10, so that the component tape 100 is held by the reel 110. On a side face of the reel 110, there is provided a bar code 112 as a storing-member code (storing-member information medium portion). The bar code 112 has reel information recorded thereto. The reel information relates to the reel 110, and includes data elements indicative of type number (kind) and dimensions of the components 34 held by the reel 110, number of the components 34 held by the carrier tape 102 (i.e., number of the components 34 carried by a new component tape 100 which has not yet supplied any one of the components 34), width and thickness of the component tape 100, and spacing pitch at which the components 34 are arranged on the carrier tape 102, and also a data element indicating whether the component tape 100 is of the emboss-carrier type or punch-carrier type.

Figure 3:
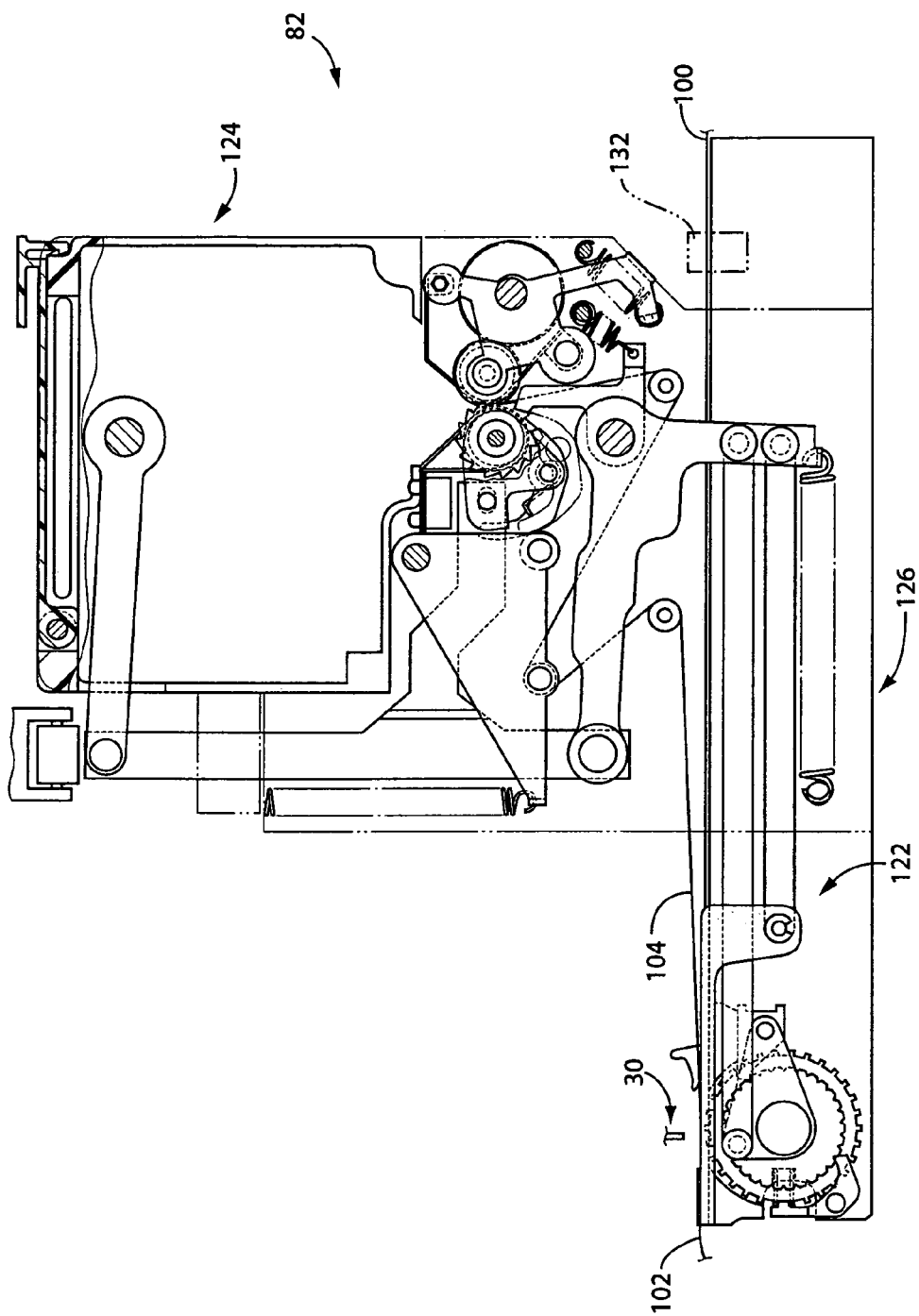
FIG. 3 is a front view (partly in cross section) showing a tape feeder of a component supplying device which is a component of the above-described electronic-circuit-component mounting system.

The feeder 82 is equipped with a tape holding device 120 (see FIG. 2) (or a reel holding portion 120 as a storing-member holding portion for holding the reel 110 which stores the component supplying tape 100), a feeding device 122 (see FIG. 3) and a cover-tape storing device 124 (see FIG. 3) for storing the cover tape 104 which has been peeled off from the carrier tape 102. Since the feeder 82 has a construction similar to that of a feeder disclosed in JP-A-2002-33596, the detailed description is not provided. The feeding device 122 is adapted to intermittently feed the component tape 100 in the longitudinal direction of a feeder body 126 (corresponding to the longitudinal direction of the carrier tape 102 and the component tape 100), by a predetermined distance as measured in the Y-axis direction per each feed motion, so that the components 34 accommodated in the respective accommodating recesses 106 are sequentially positioned in the supplying portion (component supplying position). The supplying portion is positioned below the component holding device 30 of the component mounting device 18, when the component holding device 30 is positioned in its component receiving position for receiving each component 34 supplied from the component supplying device 20. That is, the supplying portion corresponds to a portion (position) in which each component 34 is supplied to the component holding device 30. The feeder 82 is provided with a connecting-portion detecting device 132, as shown in FIG. 3, which is arranged to detect a connecting portion between two mutually connected component tapes 100. The connecting-portion detecting device 132 will be described later in detail.

When the component tape 100 wound on the reel 110 has been almost exhausted of the components 34 as a result of successive supply of the components 34, another component tape 100 is supplied by an operator of the system. In this instance, the reel 110 storing the almost exhausted tape 100 (referred to as "preceding component tape") is removed from the tape holding device 120, and then the almost exhausted tape 100 is removed from the reel 110. Another reel 110 storing a new component tape 100 (referred to as "following component tape") is mounted onto the tape holding device 120, and then a leading end portion of the new component tape 100 is pulled out, and then the preceding and following component tapes 100 are connected with each other. The connection of the component tapes 100 is made, as shown in FIG. 6, by connecting (splicing) a trailing end portion (tail end portion) 140 of the preceding component tape 100 with the leading end portion (top end portion) 142 of the following component tape 100 through a connecting piece 150 and a connecting tape 152 each of which serves as a connecting member.

Figure 7:
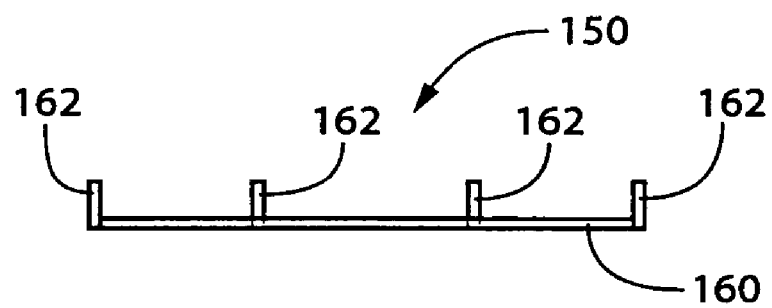
FIG. 7 is a front view showing a connecting member for connecting the above-described two component tapes.

The connection of the component tapes 100 with use of the metallic connecting piece 150 is made, for example, in a manner similar to that disclosed in JP-A-H11-40984. As shown in FIG. 7, the connecting piece 150 has a main body portion 160 provided by a rectangular plate made of a metallic material such as an iron, and a plurality of staples 162 each of which protrudes from the main body portion 160 in a direction perpendicular to the main body portion 160. The main body portion 160 has a plurality of feed holes 161 formed therein such that the feed holes 161 are arranged at the same spacing pitch as the feed holes 108 of the component tape 100 (see FIG. 8). The connecting piece 150 is positioned to bridge the trailing and leading end portions 140, 142 of the two component tapes 100, such that the main body portion 160 of the connecting piece 150 is held in close contact, at its surface from which the staples 162 protrude, with a lower surface (rear surface) of one of the supported portions 105 of the carrier tape 102 (which one has the feed holes 108 formed therein). The staples 162 are caulked by a connecting tool (not shown), whereby the two component tapes 100 are connected with each other.

Figure 6:
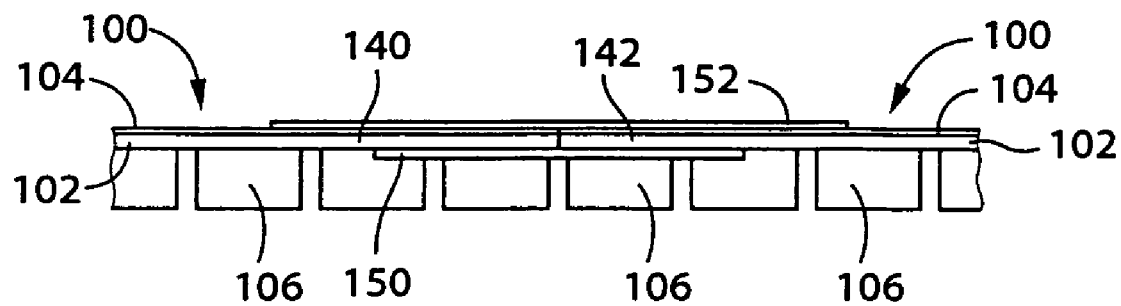
FIG. 6 is a front view showing a connecting portion between the above-described component tape and another component tape.
Figure 8:
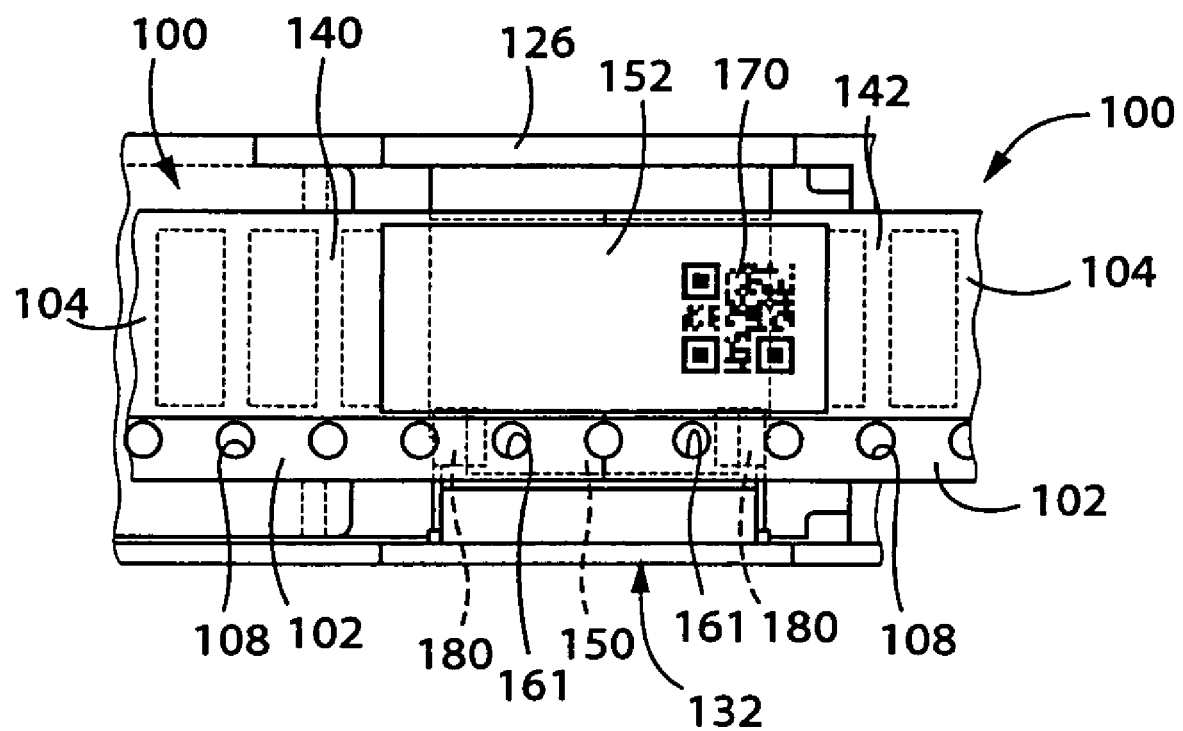
FIG. 8 is a plan view showing the connecting portion between the above-described two component tapes.

After the carrier tapes 102 of the respective two component tapes 100 have been connected through the connecting piece 150 as described above, the cover tapes 104 of the respective two component tapes 100 are connected through the connecting tape 152 made of a synthetic resin, as shown in FIGS. 6 and 8. The connecting tape 152 is bonded, at one of its opposite surfaces which has an adhesive applied thereonto, to the cover tapes 104 of the preceding and following component tapes 100. In this instance, positioning means may be used for facilitating the connection of the tapes 100 through the connecting tape 152. For example, the positioning means may be provided by a plurality positioning projection portions which are provided in an auxiliary sheet. The connecting tape 152 is first disposed on the auxiliary sheet so as to be held by auxiliary sheet, and the positioning projection portions of the auxiliary sheet are then brought into engagement with the feed holes 108 of the carrier tapes 102 of the preceding and following component tapes 100, so that the connecting tape 152 is positioned relative to the component tapes 100. After the connecting tape 152 has been positioned relative to the component tapes 100, the connecting tape 152 is removed from the auxiliary sheet, so as to be bonded to the cover tapes 104 of the preceding and following component tapes 100, such that the connecting tape 152 bridges the cover tapes 104 of the preceding and following component tapes 100. Although it is preferable that the connecting tape 152 is attached to the cover tapes 104 by the adhesive or sticker as described above, the connecting tape 152 may be otherwise attached to the cover tapes 104.

In the present embodiment, a two-dimensional code 170 as a component-tape code is provided in a rear end portion of the connecting tape 152 as viewed in a feed direction of the component tapes 100 (i.e., in a portion of the connecting tape 152 which portion is bonded to the leading end portion 142 of the following component tape 100). Thus, the connecting tape 52 is a code-carrying connecting tape which is a kind of code-carrying connecting member. In the present embodiment, the two-dimensional code 170 represents, for example, type number and dimensions of the components 34 of the following component tape 100, number of the components 34 of the tape 100 (i.e., number of the components 34 held by a new component tape 100 which has not yet supplied any one of the components 34), width and thickness of the component tape 100, spacing pitch in the arrangement of the components 34, type of the component tape 100 (e.g., whether it is of the emboss-carrier type or punch-carrier type), name of the maker and number of the production lot. That is, the two-dimensional code 170 represents the same information as the bar code 112 provided in the reel 110 of the following component tape 100. The method of providing the two-dimensional code 170 will be described later.

The connecting-portion detecting device 132 is a kind of recognition-enabling-condition detecting device for detecting a condition which enables recognition of the two-dimensional code 170 by an ID decoder as a component-tape code recognizing device which is described later. In the present embodiment, the connecting-portion detecting device 132 is provided by a metal detector capable of detecting the connecting piece 150 made of a metallic material, and is arranged to detect the connecting portion of the two component tapes 100 by detecting the connecting piece 150. Since the detection of the connecting portion is made by the detection of the connecting piece 150, for example, in a manner similar to that disclosed in JP-A-2000-13092, it will be briefly described. As shown in FIG. 8, the connecting-portion detecting device 132 has a pair of electrodes 180 which are spaced apart from each other in the direction of feed of the component tapes 100, and a connection detecting circuit (not shown). The pair of electrodes 180 are electrically connected with each other via the connecting piece 150, which are brought into contact with the electrodes 180 when the connecting piece 150 passes over the electrodes 180 as the component tapes 100 are fed. The connection detecting circuit is constructed to output a signal which varies depending upon whether the pair of electrodes 180 are electrically connected via the connecting piece 150 or not. Thus, the content of signal indicates whether the connecting piece 150 is positioned right above an area defined by the pair of electrodes 180, whereby the connecting portion of the two component tapes 100 is detected by detecting the connecting piece 150. The connecting-portion detecting device 132 does not have to be provided necessarily by a contact-type sensor such as the above-described metal detector, but may be provided by a proximity sensor as a kind of non-contact-type sensor, a photoelectric sensor of light-reflection type or a photoelectric sensor of light-transmission type.

On the Y-axis slide 44, as shown in FIGS. 1 and 2, there is provided an ID decoder 190 as a two-dimensional code recognizing device which is a kind of the component-tape code recognizing device, such that the ID decoder 190 is located on one of opposite sides of the component holding device 30 which one is close to the component supplying device 20 as viewed in the Y-axis direction. The ID decoder 190 is constituted by a CCD area sensor as a kind of optical reading device which optically reads the two-dimensional code 170 provided in the connecting tape 152.

Figure 9:
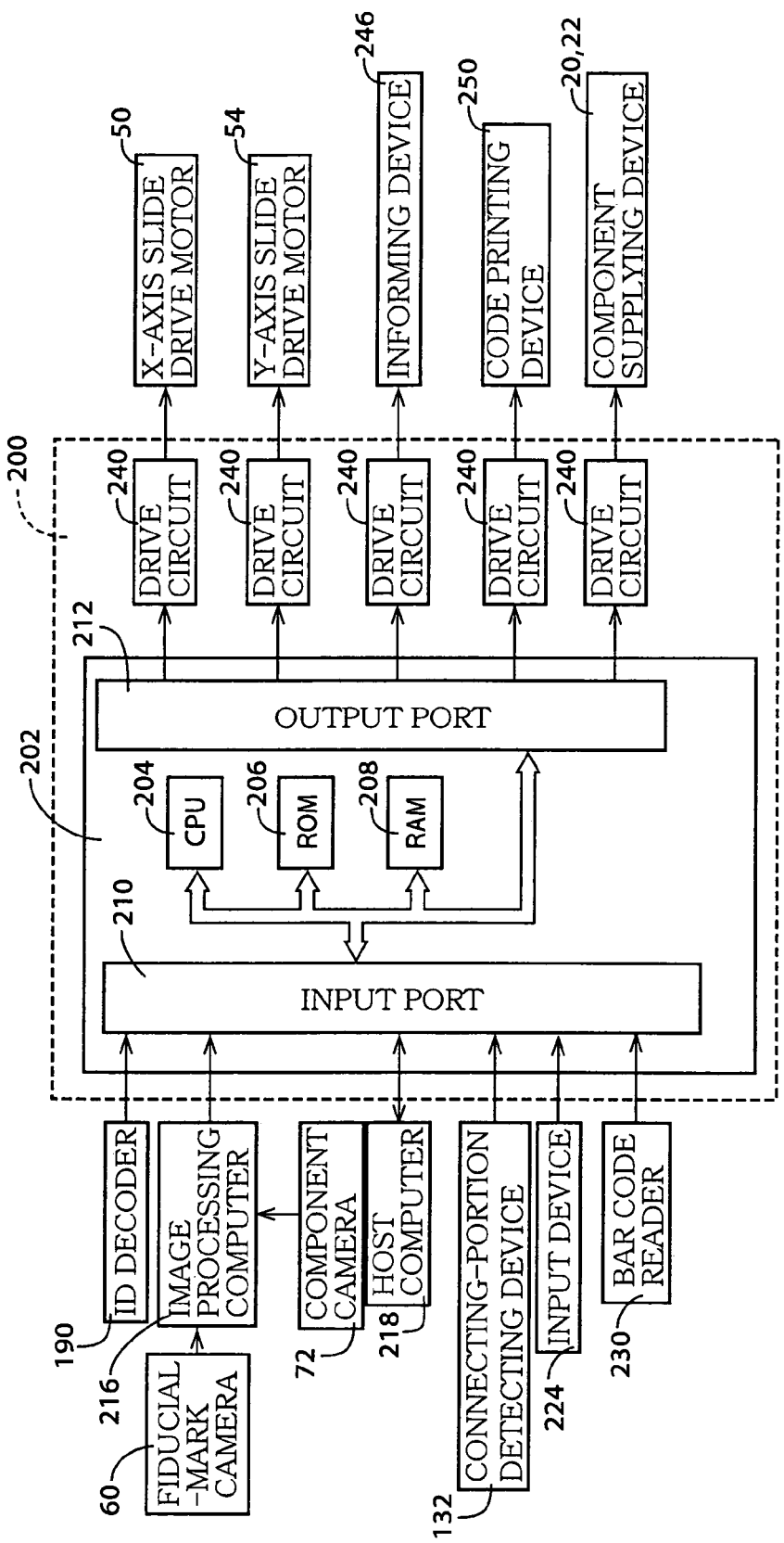
FIG. 9 is a block diagram showing portions of a control device for controlling the above-described electronic-circuit-component mounting system, which portions closely relate to the present invention.

The present electronic-circuit-component mounting system is controlled by a control device 200 as shown in FIG. 9. The control device 200 is principally constituted by a computer 202 incorporating a CPU 204, a ROM 206, a RAM 208, an input port 210 and an output port 212 which are interconnected via bus lines. To the input port 210, there are connected an input device 224, various computers and detectors such as an image processing computer 216 which processes data of images taken by the fiducial-mark camera 60 and the component camera 72, a host computer 218, the connecting-portion detecting device 132 and the ID decoder 190. In the present embodiment, the input device 224 has ten digit keys, function keys, alphabet keys, etc. used for data entry by the operator. To the input port 210, there is also connected a bar code reader 230 which is described later.

To the output port 212, there are connected various actuators such as the X-axis slide drive motor 50, the component supplying devices 20, 22 and an informing device 246, through respective drive circuits 240. To the output port 212, there is also connected a code printing device 250 which is described later. In the present embodiment, the X-axis slide drive motor 50 and other motors as drive sources are provided by servomotors each of which is, as a kind of rotary motor, an electrically-operated rotary motor whose operating angle is controllable with a high precision. However, the servomotors may be replaced by stepping motors. Although the detailed illustration is not provided, the operating angle of each of the drive motors such as the X-axis slide drive motor 50 is detected by a rotary encoder, so that each of the drive motors is controlled based on result of the detection by the rotary encoder. In the present embodiment, the informing device 246 is arranged to provide information by sound emission of a buzzer and light emission of a lamp. However, the informing device 246 may be adapted to provide the information by one of them, or by at least one of flickering operation of the light, literal presentation on a display screen and graphical presentation on the display screen.

The RAM 208 stores various programs and data such as a main routine, a program for mounting the components 34 onto the printed-wiring board 12, a program for replenishing each feeder 82 with the components 34, and an erroneous-connection preventing program that is described later.

The above-described host computer 218 is a computer for controlling a plurality of systems such as the electronic-circuit-component mounting system, and has information relating to each of the systems. For example, the information relating to the electronic-circuit-component mounting system is a data set relating to the operation for mounting the components 34 onto the printed-wiring board 12. Such a data set includes data elements indicative of kind, number, mounting order (attached positions of the feeders 82 in the feeder support base 92) of the feeders 82 to be mounted on the feeder support base 92, and kind of the reel 110 to be held by each feeder 82, which are determined depending on kind of the printed-wiring board 12, and data elements indicative of number of the components 34 to remain in each feeder 82 upon completion of supply to each printed-wiring board 12, kind and number of the printed-wiring boards 12 onto which the components 34 are to be mounted, kinds of the components 34 to be mounted onto each printed-wiring board 12, and mounting positions in each printed-wiring board 12 in which the components 34 to be mounted. The host computer 218 and the computer 202 (hereinafter referred to as system computer 202) of the control device 200 of the electronic-circuit component mounting system communicate with each other, so that exchange of information and supply of commands are made therebetween whereby required data is supplied to the system computer 202.

The above-described control device 200 and the host computer 218 cooperate with each other to have function to manage the number of the components 34 remaining in each feeder 82 of the component supplying device 20 and each tray 84 of the component supplying device 22. The host computer 218 is provided with a remaining component memory which memories the number of the components 34 stored or remaining in each feeder 82 and tray 84, in relation with identification code of each feeder 82 and tray 84, so that the host computer 218 provides the control device 200 with data indicative of number of the components 34 currently stored or remaining in each feeder 82 or tray 84 when each feeder 82 or tray 84 is mounted onto the component supplying device 20 or 22. The control device 200 is adapted to memorize the number of the components stored or remaining in each feeder 82 or tray 84, and to update the data indicative of the number of the remaining components every time each one of the components 34 is supplied from each feeder 82 or tray 84. Further, every time supply of the components 34 by the following component tape 100 (or new tray 84) is initiated, the data is reset to number of the components 34 held by the following component tape 100 (or new tray 84).

The above-described "initiation of the supply of the components by the following component tape 100" can be detected in various manners. However, in the present embodiment, it is detected by detecting a fact that a predetermined number of the components 34 have been supplied by the preceding component tape 100 after the detection of the connecting portion of the two component tapes 100 by the connecting-portion detecting device 132. The number of the components 34 held by the preceding component tape 100, extending from the connecting portion to the component supplying position, at the point of time at which the connecting portion is detected is known. Therefore, when the known number of the components 34 have been supplied, the leading end of the following component tape 100 reaches the component supplying position, for initiating the supply of the components 34 by the following component tape 100.

The control device 200 updates the number of the components 34 remaining in each feeder 82 and tray 84, as described above, and transmits the data indicative of the number of the remaining components 34 to the host computer 218 when the feeder 82 or tray 84 is removed from the component supplying device 20 or 22. The host computer 218 updates the content of the remaining component memory, in accordance with the data transmitted from the control device 200.

When the component tape 100 wound on the reel 110 has been almost exhausted of the components 34 as a result of successive supply of the components 34, the control device 200 informs the operator of this fact. Described specifically, when the number of the components 34 remaining in each feeder 82 or tray 84 becomes equal to or smaller than a predetermined number, the fact is informed by the indication on the display screen, and at the same time the informing device 246 is activated. In response to that, the operator replenishes the feeder 82 or tray 84 with the component tape 100.

There will be described a component mounting operation in the present electronic-circuit component mounting system.

A preparation is first made prior to initiation of the mounting operation. Before the plurality of feeders 82 are mounted onto the feeder support base 92, the component tape 100 is mounted onto each of the feeders 82. In this instance, the bar code 112 provided in each of the reel 110 and feeder 82 (the bar code provided in each feeder 82 is not shown) is read by the bar code reader 230. The bar code provided in each feeder 82 has feeder information recorded therein. The feeder information includes a feeder identification code which indicates kind of the corresponding feeder 82 and identifies the corresponding feeder 82. It is determined whether the bar code 112 of the reel 110 is a predetermined code (or corresponds to the bar code of the feeder 82 onto which the reel 110 is to be mounted). If the bar code 112 is not the predetermined code, the operator is informed of this fact by the informing device 246. The read bar code 112 is stored into the RAM 208. After the reel 110 is mounted onto the tape holding device 120, each feeder 82 is attached to a predetermined attached position in the feeder support base 92.

In the present electronic-circuit component mounting system, for mounting each component 34 onto the printed-wiring board 12, the component holding device 30 is moved by the component-holding-device moving device 32 to the supplying portion of the feeder 82, and then lowered by the above-described component-holding-device elevating device so as to hold the component 34. The component 34 held by the component holding device 30 is moved to the printed-wiring board 12. On its way to the printed-wiring board 12, when the component 34 passes by the component-image taking system 70, the image of the component 34 is taken by the component camera 72, for obtaining a center position error and an angular position error of the component 34 as held by the component holding device 30. The angular position error is corrected by rotation of the component holding device 30 by the above-described component-holding-device rotating device, while the center position error is corrected by compensating the distance of movement of the component holding device 30 to the printed-wiring board 12. In this instance, the distance of movement of the component holding device 30 is compensated further on the basis of a center position error and an angular position error of the mounting position on the printed-wiring board 12, which errors are recognized based on the taken images of the fiducial marks. When the component holding device 30 has been moved to be positioned above the mounting position, the component holding device 30 is lowered by the component-holding-device elevating device, so as to mount the component 34 onto the printed-wiring board 12.

When the number of the components 34 remaining in the component tape 100 wound on the reel 110 of each feeder 82 becomes small as a result of successive supply of the components 34, this fact is informed by the informing device 246 and the display screen, so that the feeder 82 in question is replenished with the components 34 in response to the informed fact. That is, in the feeder 82 (connectable feeder 82) in question, connection of the following component tape 100 with the currently used component tape 100 is effected by the operator. The operator is thus informed of the fact that there exists the connectable feeder 82 in which the currently used component tape 100 can be connected to the following component tape 100, before the currently used component tape 100 is exhausted of the components 34. Therefore, in response to the informed fact, the operator can carry out the tape connecting operation and replenish the feeder 82 with the components 34, before the component tape 100 is exhausted of the components 34. Thus, owing to the tape connecting operation in the connectable feeder 82, the exhaustion of the components 34 is avoided or a number of occurrences of the exhaustion is reduced. Further, the tape connecting operation can be made rapidly and appropriately in accordance with the indication of the display screen. Further, owing to the activation of the informing device 246 and the connection of the tapes 100 in the connectable feeder 82, the feeder 82 can be replenished with the components 34 in an early stage, thereby avoiding delay of the replenishment and improving reliability in the supply of the components 34. In the present electronic-circuit component mounting system in which the component supplying device 20 is disposed in a fixed position, the tape connecting operation can be made irrespective of whether the components 34 are being currently supplied or not. It is noted that the operator may carry out the tape connecting operation every time each feeder 82 becomes connectable, or every time a number of the connectable feeders 82 is equal to or larger than a predetermined number.

There will be described, by reference to FIG. 10, a component-tape code providing process for providing the two-dimensional code 170 in the following component tape 100, wherein the component-tape code providing process includes a step of preparing the connecting tape 152 and a step of connecting the two component tapes 100 through the connecting tape 152. In a storing-member code recognizing step as step 1 (hereinafter referred to as "S1": the other steps being similarly referred) of the component-tape code providing process, the bar code 112 provided in the reel 110 of the following component tape 100 is read by the bar code reader 230. The read bar code 112 is, in the control device 200, converted into the identification code in the form of the two-dimensional code 170, wherein information represented by the two-dimensional code 170 corresponds to that represented by the bar code 112 (the content of information represented by the two-dimensional code 170 is the same as that represented by bar code 112 in the present embodiment). The two-dimensional data 170 is printed on the connecting tape 152 by the code printing device 250 in a code printing step as S2 of component-tape code providing process. In a connecting step as S3 of the process, the trailing end portion 140 of the preceding component tape 100 and the leading end portion 142 of the following component tape 100 are connected to each other through the connecting piece 150, while being positioned relative to each other. In this instance, the connecting tape 152 is attached to the trailing and leading end portions 140, 142 of the tapes 100.

Figure 11:
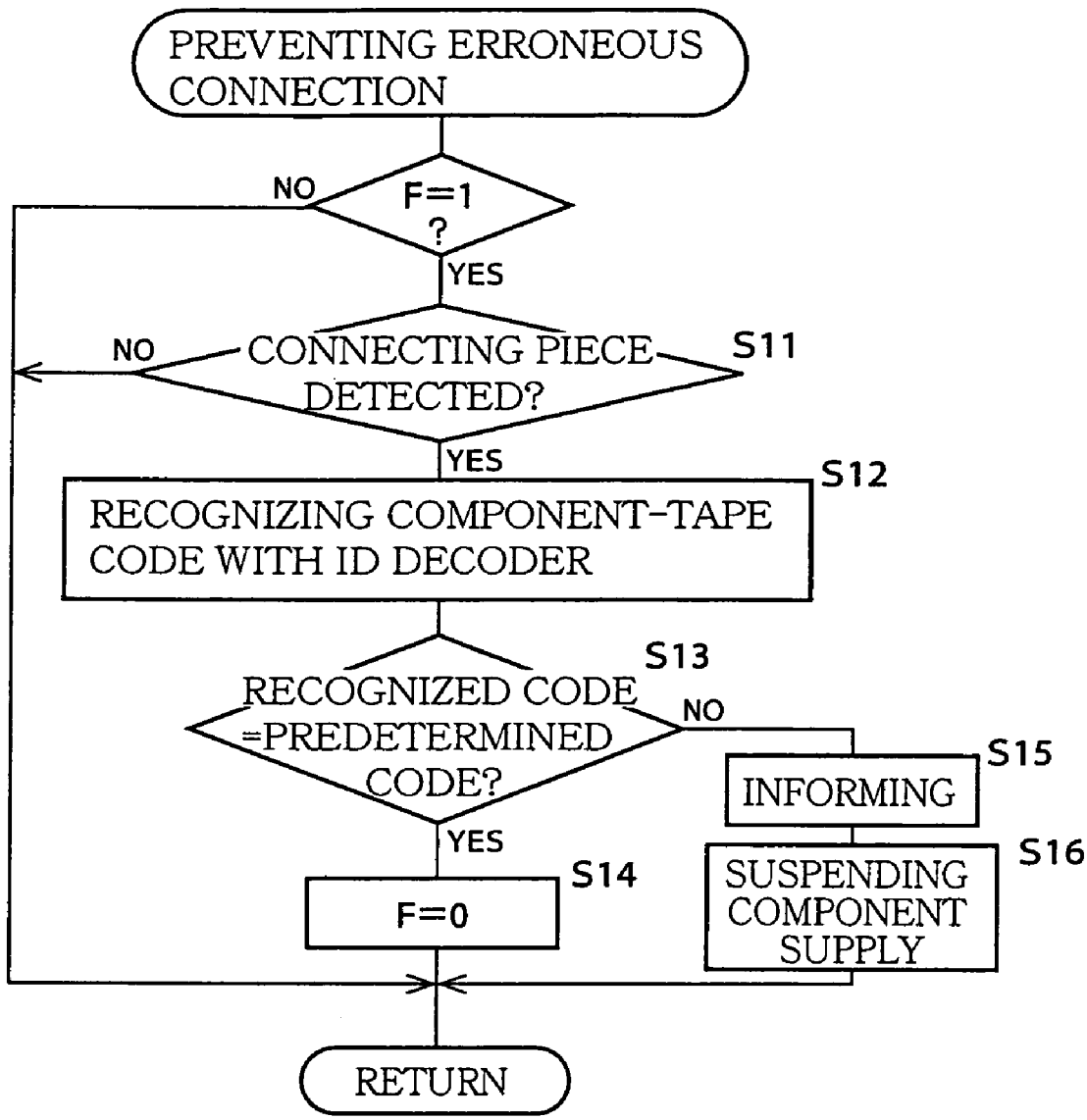
FIG. 11 is a flow chart showing an erroneous-connection preventing program stored in RAM of the above-described control device.

Next, there will be described, on the basis of the flow chart of FIG. 11, the erroneous-connection preventing program stored in the RAM 208. The present program is initiated with S10 in which it is determined whether a connection enable flag is in its ON state or not. As described above, when the number of the components remaining in any one of the feeders 82 is equal to or smaller than a predetermined number, the operator is informed of the fact that the following component tape 100 can be connected to the preceding component tape 100 in the feeder 82. In this instance, at the same time, the connection enable flag is set to ON. Since the connection enable flag is normally in its OFF state, the first execution of the erroneous-connection preventing program is terminated with a negative decision in S10. If an affirmative decision is obtained in S10, S11 is repeatedly implemented to determine whether the connecting portion has been detected by the connecting-portion detecting device 132 or not. Since the tape connecting operation is made by the operator in response to the above-described connection enable information, the connecting portion is detected whereby an affirmative decision is obtained in S11. In this instance, the two-dimensional code 170 provided in the connecting tape 152 is precisely opposed to the ID decoder 190, so that the two-dimensional code 170 provided in the connecting tape 152 is recognized by the ID decoder 190 in S12.

In the following S13, it is determined whether each data element of the recognized two-dimensional code 170 corresponds to the corresponding data element of a preceding component-tape code as a predetermined component-tape code. The preceding component-tape code corresponds to the content of the bar code 112 of the reel 110, which has been read by the bar code reader 230 and stored into the RAM 208 when the feeder 82 has been mounted onto the feeder support base 92. Therefore, an affirmative decision in S13 means that the predetermined component tape 100 has been correctly connected. The affirmative decision in S13 is followed by S14 in which the connection enable flag is reset to OFF, so that the component supplying operation is continued. On the other hand, a negative decision in S13 means that a wrong component tape 100 has been erroneously connected. The negative decision in S13 is followed by S15 in which the operator is informed of this fact. S16 is then implemented to suspend the supply of the components 34. In this instance, the supply of the components 34 from all the feeders 82 may be suspended, or alternatively, only the supply of the components 34 from the feeder 82 in which the wrong component tape 100 has been connected to the preceding component supply tape 100 may be suspended. In the latter case, it is preferable that the component supply from the feeder 82 whose supply has been suspended is preceded by the component supply from the other feeders 82, while the replenishment of the feeder 82 with a correct component tape is being awaited. Where there is mounted, on the feeder support base 92, another feeder 82 which supplies the same components 34 as those to be supplied by the feeder 82 whose supply has been suspended, it is preferable that the components 34 are supplied by this another feeder 82 in place of the feeder 82 in question.

In the present embodiment, the recognized two-dimensional code 170 provided in the connecting tape 152 is compared with the bar code 112, as the predetermined component-tape code, which has been read when each feeder 82 has been mounted onto the feeder support base 92, not only in the first tape-connecting operation but also in the second and following tape-connecting operations effected for each feeder 82. However, the content of the predetermined component-tape code may be updated each time the tape-connecting operation is effected, such that the content of the predetermined component-tape code corresponds to that of the two-dimensional code 170 recognized after the previous tape-connecting operation.

In the present embodiment, the recognizing step S12 implemented by the control device 200 constitutes a component-tape code recognizing step, and the comparing step S13 implemented by the control device 200 constitutes an information generating step which is one form of a code utilizing step. It is possible to consider that each of the comparing step S13, the connection-enable-flag resetting step S14, the informing step S15 and the supply suspending step S16 individually constitutes one form of the code utilizing step, or all of these steps cooperate with one another to constitute one form of the code utilizing step. The step S1 of the component-tape code providing process constitutes a storing-member code recognizing step. The step S2 of the component-tape code providing process constitutes a code printing step as a code-carrying connecting-member preparing step. The step S3 of the component-tape code providing process constitutes a connecting step of connecting the trailing end portion of one of the component tapes with the leading end portion of the other of the component tapes. Each of the above-described storing-member code recognizing step, code-carrying connecting-member preparing step, connecting step constitutes the component-tape code providing process, or all of these steps cooperate with one another to constitute the component-tape code providing process. Further, the bar code reader 230 constitutes a storing-member code recognizing device, and the code printing device 250 constitutes a connecting-member code providing device. The above-described storing-member code recognizing device and connecting-member code providing device cooperate with each other to constitute a code-carrying connecting-member preparing device which is included in a component-tape code providing device. The bar code reader 230 cooperates with a portion of the control device 200 assigned to implement the step S1, to constitute a storing-member code recognizing portion. The code printing device 250 cooperates with a portion of the control device 200 assigned to implement the step S2, to constitute a component-tape code providing portion. The control device 200 includes a comparing portion assigned to implement the step S15, an informing portion assigned to implement the step S17 and a supply suspending portion assigned to implement the step S18. The comparing portion, informing portion and supply suspending portion cooperate with one another to constitute an information generating portion which is one form of a code utilizing device.

In the present embodiment, it is possible to prevent supply of wrong components 34 where two component tapes are spliced to each other. Since the connecting tape 152 is provided with the two-dimensional code 170 as the identification code of the following component tape 110, the two-dimensional code can be easily recognized from a direction opposed to the two-dimensional code. This arrangement is favorable for recognizing the two-dimensional code while the feeder 82 is mounted on the feeder support base 92.

Figure 12:
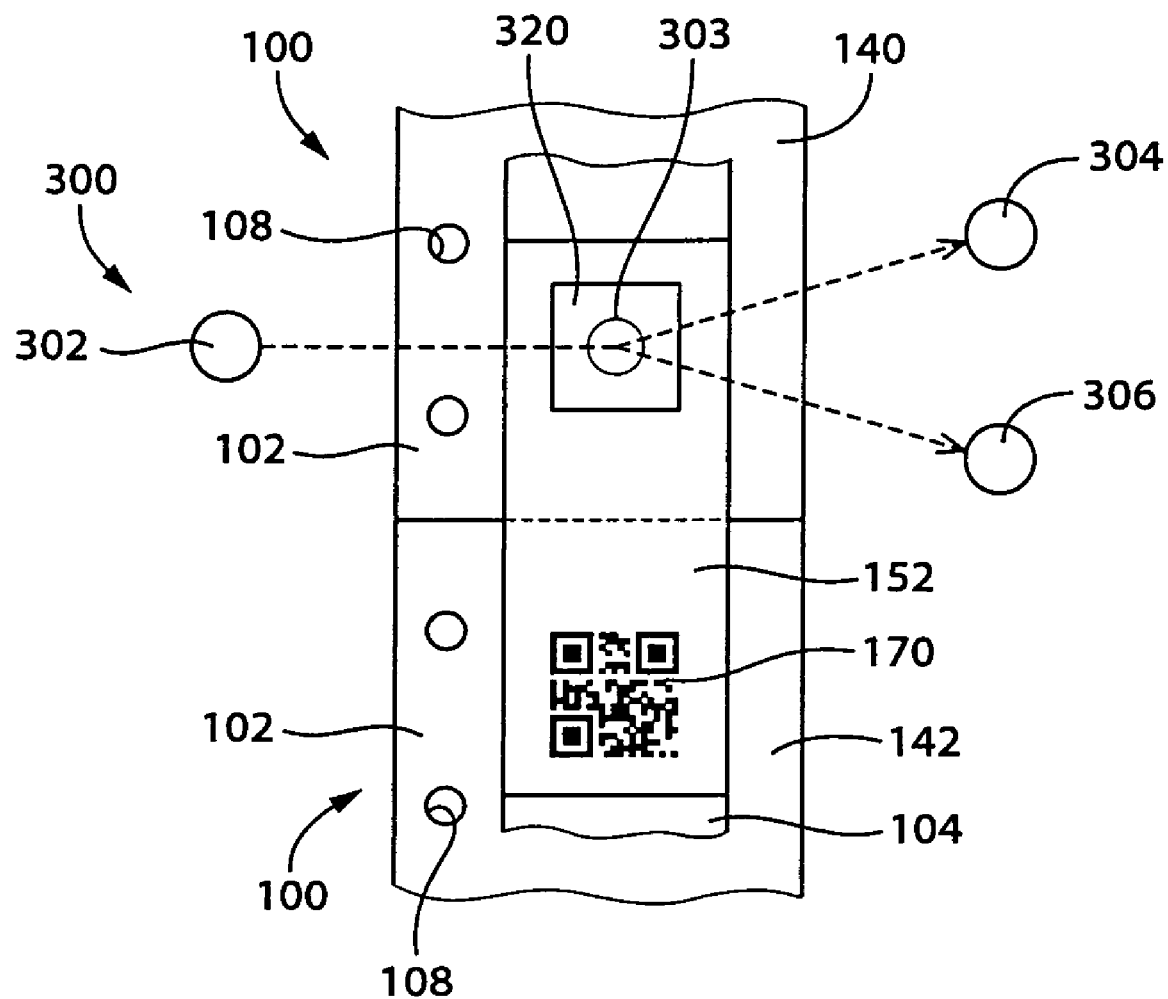
FIG. 12 is a plan view schematically showing a connecting portion between two component tapes and a recognizable-state detecting device in an electronic-circuit-component mounting system which is another embodiment of the present invention.

In the above-described embodiment, a portion (the connecting piece 150 made of a metallic material) made of a material different from that of the component tape 100 is detected by the connecting-portion detecting device 132 as the recognition-enabling-condition detecting device. However, it is possible to employ an optical connecting-portion detecting device, for example, such that the recognition-enabling-condition detecting device is provided by a device which detects a portion having a color different from that of the component tape 100. One embodiment of the optical connecting-portion detecting device will be described by reference to FIG. 12. It is noted that the same reference numerals as used in the above-described embodiment will be used to identify the similar elements, and description of these elements will not be provided. As schematically shown in FIG. 12, the recognition-enabling-condition detecting device in the present embodiment is constituted by a photoelectric sensor 300 of light-reflection type. The light-reflection-type photoelectric sensor 300 includes a light emitting portion 302 which emits a white light, for illuminating an illuminated area 303 of the cover tape 104 of the component tape 100. The photoelectric sensor 300 includes two light receiving portions 304, 306, one 304 of which is a sensor sensitized to a red color while the other 306 of which is a sensor sensitized to a green (or blue) color. The light receiving portion 304 is equipped with a filter which permits only the red color to pass therethrough, while the light receiving portion 306 is equipped with a filter which permits only the green (or blue) color to pass therethrough. The photoelectric sensor 300 of the present embodiment is also connected to a control device having a construction similar to that of the above-described control device 200.

The two-dimensional code 170 is provided in a rear end portion of the connecting tape 152 as viewed in the feed direction (which portion is located in the leading end portion 142 of the following component tape 100), while an identification portion 320 painted with a red color is provided in a front end portion of the connecting tape 152 as viewed in the feed direction (which portion is located in the trailing end portion 140 of the preceding component tape 100). In the present embodiment, the cover tapes 104 of the component tapes 100 and the connecting tape 152 are semi-transparent, while the components 34 have a black color. That is, since the identification portion 320 is a portion different in color from the component tapes 100 and the components 34, the identification portion 320 can be clearly distinguished from the component tapes 100 and the components 34 when it is detected.

When the illuminated area 303 illuminated by the light emitting portion 302 is located in the cover tape 104, the white light is reflected at the cover tape 104, so that the light receiving portion 304 is sensitized to a red component of the white light while the light receiving portion 306 is sensitized to a green (blue) component of the white light, whereby the light receiving portions 304, 306 are both placed in ON states. When the illuminated area 303 is located in a portion in which one of the components 34 is disposed, the amount of the reflected light is considerably reduced, so that neither of the light receiving portions 304, 306 is sensitized, whereby the light receiving portions 304, 306 are both placed in OFF states. When the identification portion 320 of the connecting tape 152 is illuminated, a red light is reflected whereby the light receiving portion 304 is placed in ON state while the light receiving portion 306 is placed in OFF state. When the light receiving portions 304, 306 are thus placed in ON and OFF states, respectively, it is determined that the identification portion 320 is detected. In this instance, the two-dimensional code 170 of the connecting tape 152 is positioned to be precisely opposed to the ID decoder 190. Therefore, in response to the placements of the light receiving portions 304, 306 in ON and OFF states, respectively, the two-dimensional code 170 is recognized by the ID decoder 190.

In the electronic-circuit-component mounting system in which each of the plurality of component supplying devices is disposed in a fixed position, the component supplying devices may be arranged to supply the electronic circuit components in the same manner. Alternatively, the component supplying devices may be arranged to supply the electronic circuit components in respective different manner, as long as at least one of the component supplying devices is provided by the feeder-type component supplying device.

Although the component-tape code recognizing device is provided by the ID decoder 190 which serves exclusively to recognize the two-dimensional code 170 in the above-described embodiments, the two-dimensional code 170 may be recognized by the CCD camera constituting the image-taking device. For example, the fiducial-mark camera for taking the images of the fiducial marks provided on the board may be utilized to recognize the component-tape code.

The component-tape code may be directly provided on the component tape 100, for example, the cover tape 104, by printing the code onto it. It is preferable that the component-tape code is provided on the leading end portion of the cover tape 104 of the following component tape.

There will be described an electronic-circuit-component mounting system as still another embodiment of the present invention. It is noted that the same reference numerals as used in the above-described embodiments will be used to identify the similar elements, and description of these elements will not be provided.

Figure 16:
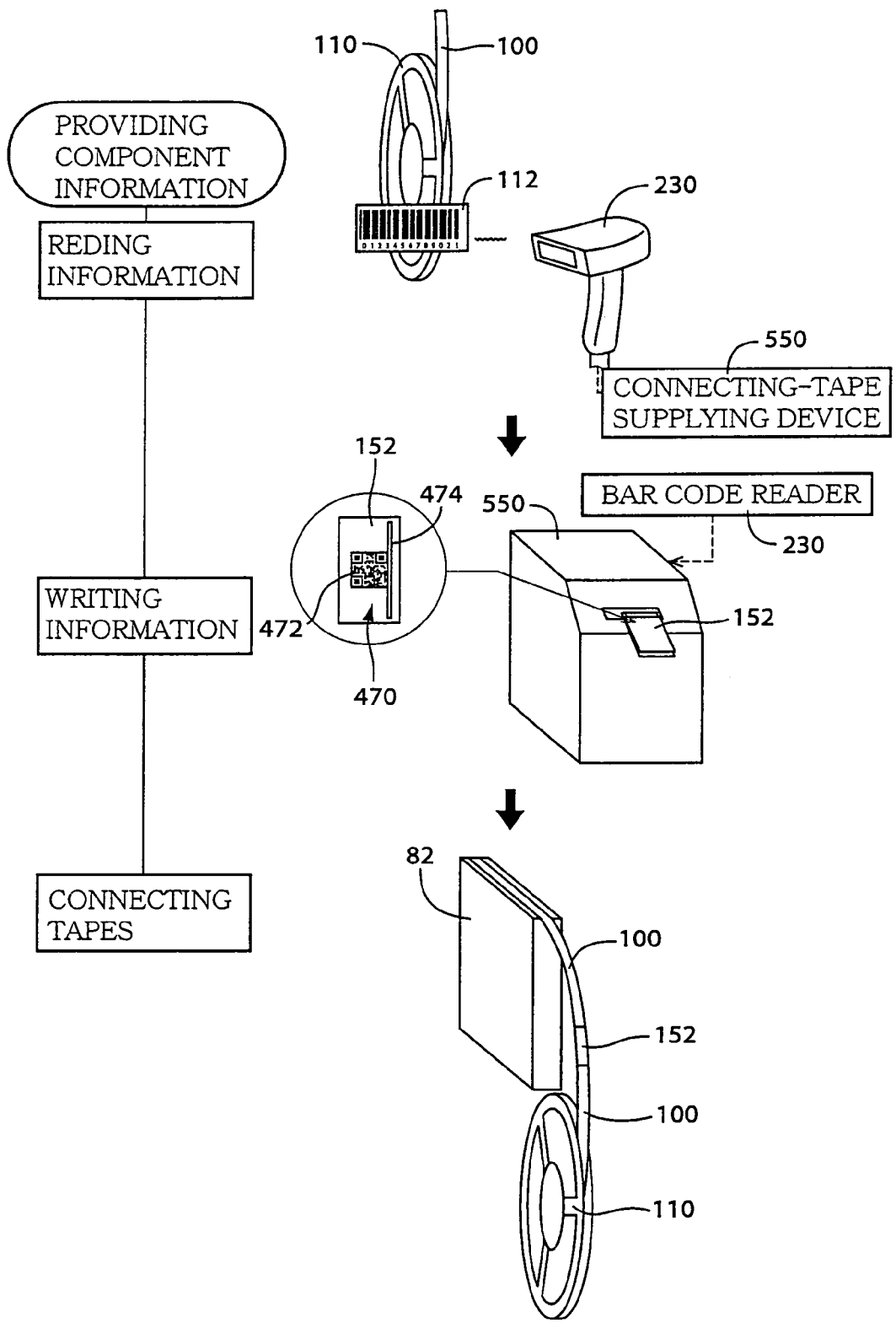
FIG. 16 is a view for explaining a method of providing component information in another connecting member which connects the above-described two component tapes.

In the present embodiment, the connecting tape 152 has the information medium portion in the form of a chip-shaped electronic tag 470 (hereinafter referred to as "tag chip 470"), as shown in FIG. 16. The tag chip 470 is fixed to the connecting tape 152, and is one example of an information transmission/storage chip including a transmitting portion capable of having communication in a non-contact manner. The tag chip 470 has a main body 472 and an antenna 474 which is elongated in a longitudinal direction of the connecting tape 152 (i.e., in the longitudinal direction of the component tapes 100), and communicates with an information reading device which is described below, so as to transmit the information to the information reading device. In the present embodiment, the tag chip 470 stores therein information indicative of type number (identification information) and dimensions of the components 34 of the following component tape 100, number of the components 34 held by the carrier tape 102 (i.e., number of the components 34 carried by a new component tape 100 which has not yet supplied any one of the components 34), width and thickness of the component tape 100, spacing pitch in the arrangement of the components 34, type of the component tape 100 (e.g., whether it is of the emboss-carrer type or punch-carrier type), name of the maker and the production lot. That is, the tag chip 470 represents the same information as the bar code 112 provided in the reel 110 of the following component tape 100. A method of providing the information relating to the components 34, in the tag chip 470 provided in the connecting tape 152 will be described later.

Figure 13:
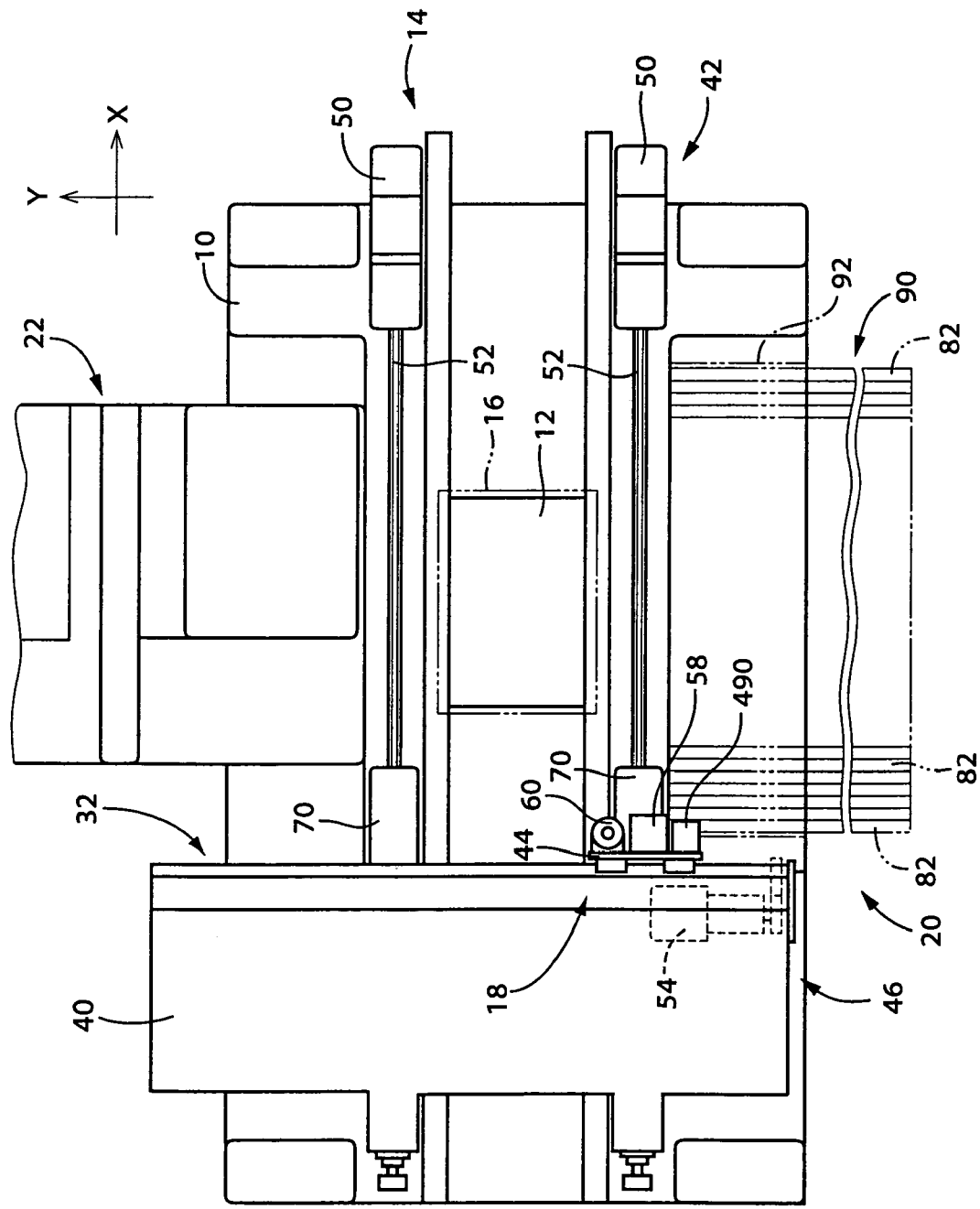
FIG. 13 is a plan view schematically showing an electronic-circuit-component mounting system which is still another embodiment of the present invention.
Figure 14:
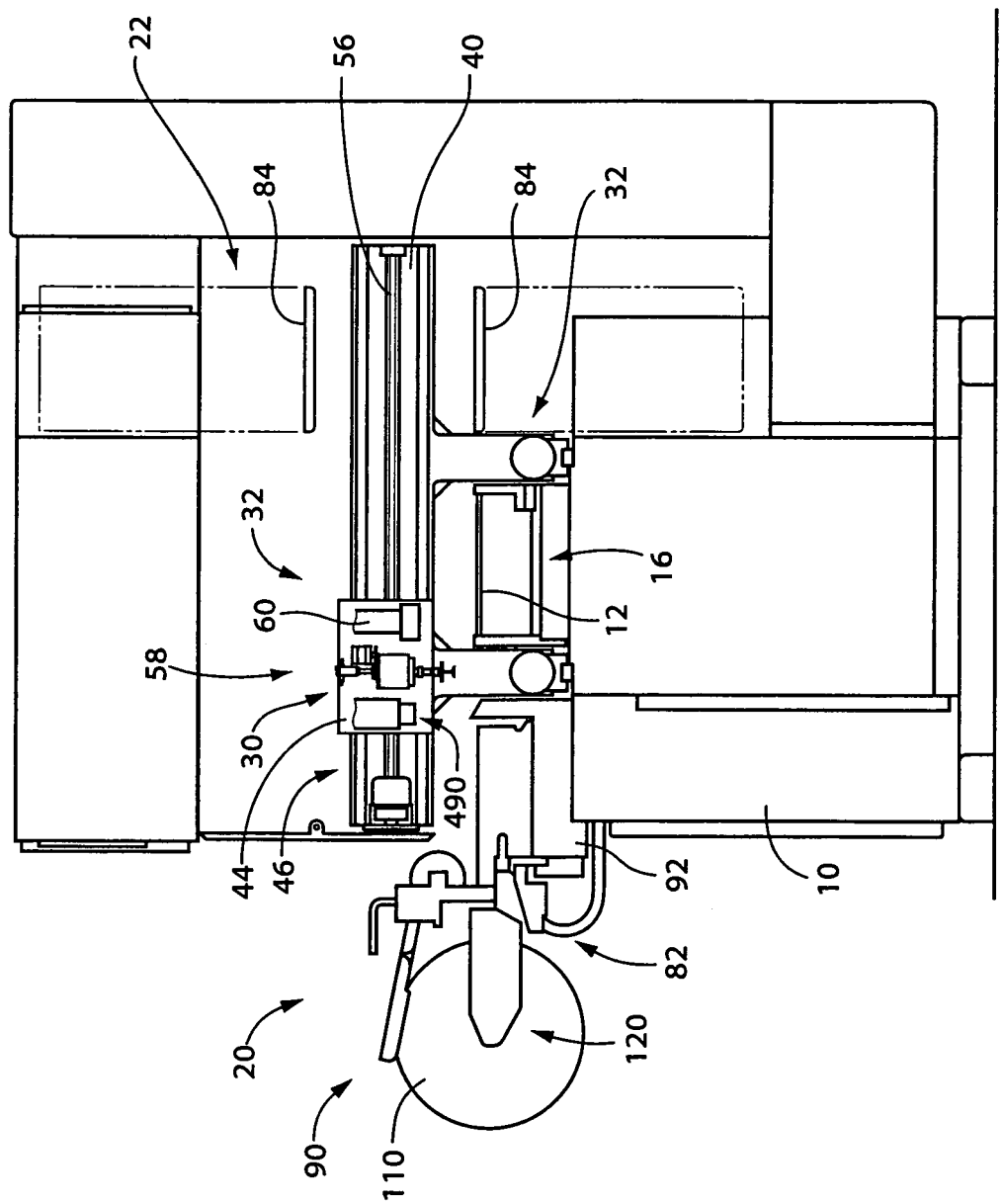
FIG. 14 is a front view of the above-described electronic-circuit-component mounting system.

On the Y-axis slide 44, as shown in FIGS. 13 and 14, there is provided a tag chip reader 490 as a connecting-tape information reading device which is a kind of tape information reading device, such that the tag chip reader 490 is distant from the component holding device 30 in the horizontal direction, more specifically, such that the tag chip reader 490 is located on one of opposite sides of the component holding device 30 which one is close to the component supplying device 20. The tag chip reader 490 is adapted to be able to communicate with the tag chip 470 when the tag chip 470 is positioned below the tag chip reader 490, so that the tag chip reader 490 can read the information stored in the tag chip 470 when the tag chip 470 is positioned in a communication enabling area located below the tag chip reader 490. Since the information is supplied from the tag chip 470 by a radio communication, the tag chip reader 490 can receive and read the information, without the tag chip reader 490 being precisely opposed to the tag chip 470.

Figure 15:
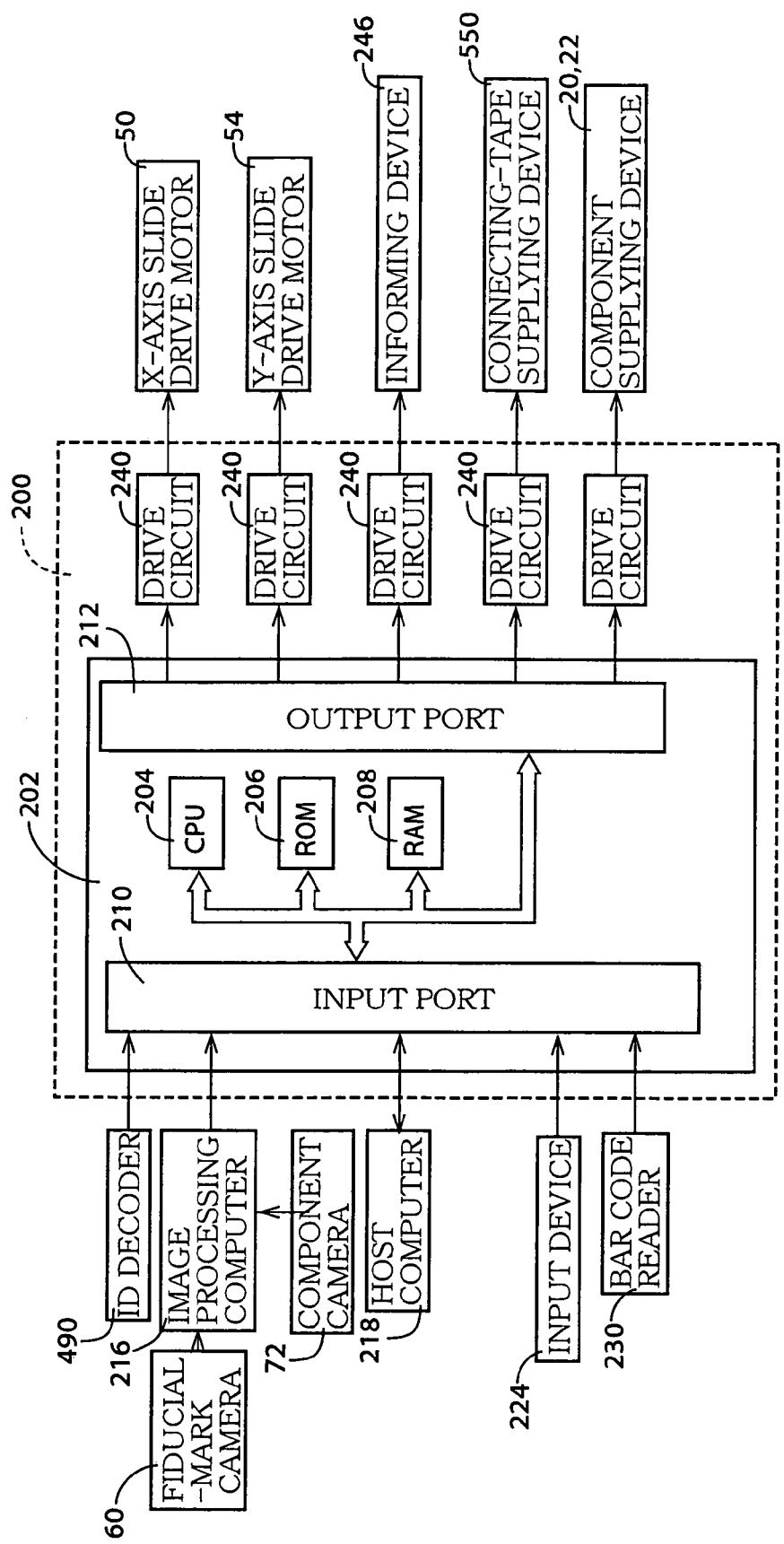
FIG. 15 is a block diagram showing portions of a control device for controlling the present electronic-circuit-component mounting system, which portions closely relate to the present invention.

The present electronic-circuit-component mounting system is controlled by the control device 200 as shown in FIG. 15. The control device 200 is principally constituted by a computer 202 incorporating the CPU 204, ROM 206, RAM 208, input port 210 and output port 212 which are interconnected via bus lines. To the input port 210, there are connected the input device 224, various computers and detectors such as the image processing computer 216 which processes data of images taken by the fiducial-mark camera 60 and the component camera 72, the host computer 218 and the tag chip reader 490. In the present embodiment, the input device 224 has ten digit keys, function keys, alphabet keys, etc. used for data entry by the operator. To the input port 210, there is also connected the bar code reader 230 which is described later.

To the output port 212, there are connected various actuators such as the X-axis slide drive motor 50, component supplying devices 20, 22 and informing device 246, through the respective drive circuits 240. To the output port 212, there is also connected a connecting-tape supplying device 550 which is described later. In the present embodiment, the X-axis slide drive motor 50 and other motors as drive sources are provided by servomotors each of which is, as a kind of rotary motor, an electrically-operated rotary motor whose operating angle is controllable with a high precision. However, the servomotors may be replaced by stepping motors. Although the detailed illustration is not provided, the operating angle of each of the drive motors such as the X-axis slide drive motor 50 is detected by a rotary encoder, so that each of the drive motors is controlled based on result of the detection by the rotary encoder. In the present embodiment, the informing device 246 is arranged to provide information by sound emission of a buzzer and light emission of a lamp. However, the informing device 246 may be adapted to provide the information by one of them, or by at least one of flickering operation of the light, literal presentation on a display screen and graphical presentation on the display screen.

Figure 18:
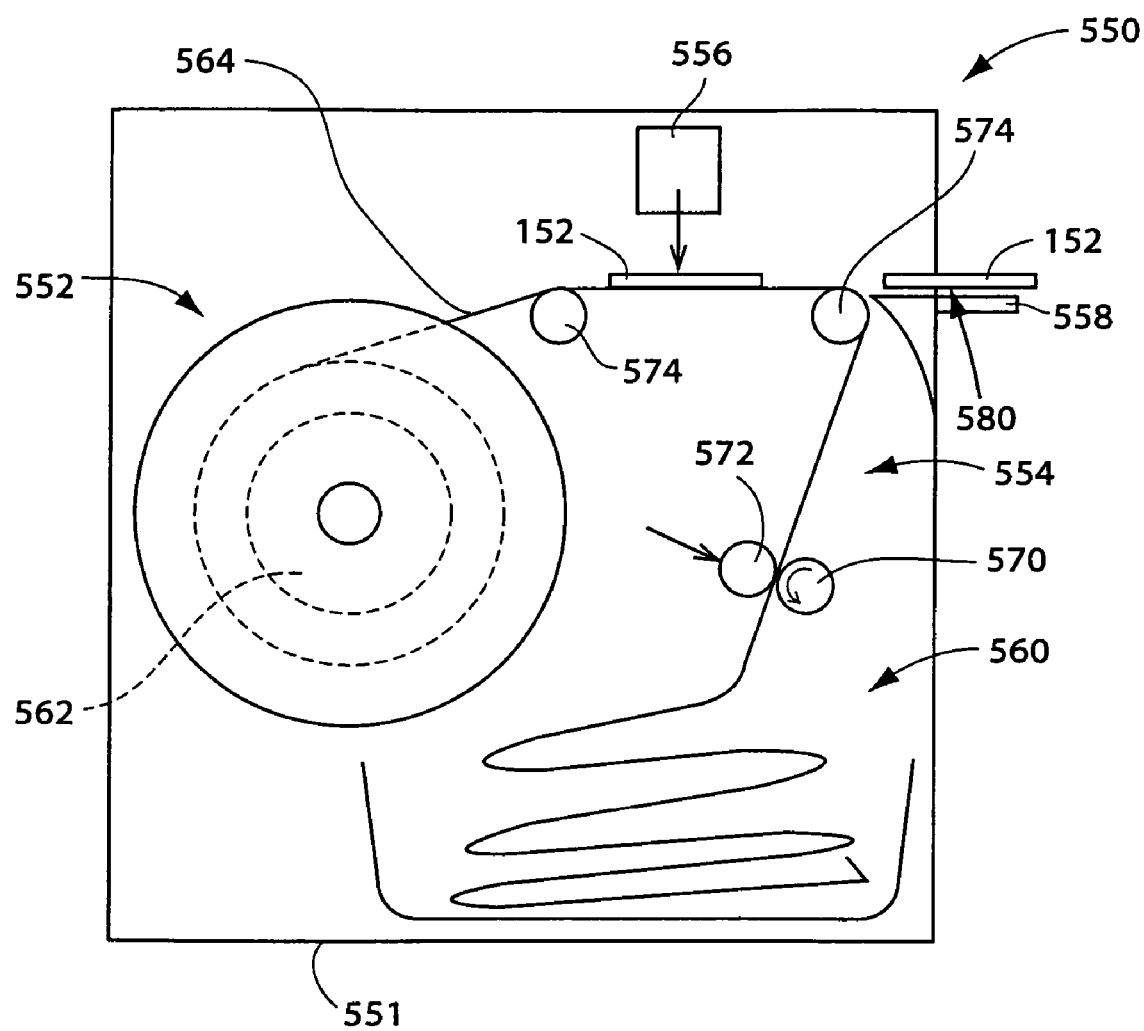
FIG. 18 is a side cross sectional view schematically showing a connecting-member supplying device for supplying the above-described another connecting member.

As shown in FIG. 18, the connecting-tape supplying device 550 has a connecting-tape storing portion 552, a connecting-tape feeding device 554, an information writing device 556, a supplying portion 558 and a holding-tape storing portion 560 which are provided in a main body 551 of the connecting-tape supplying device 550. The connecting-tape storing portion 552 has a reel holding portion provided in the main body 551 and holding a reel 562 such that the reel 562 is rotatable. The plurality of connecting tapes 152 (only two of the tapes 152 are representatively illustrated in FIG. 18 with their thickness being somewhat exaggerated) arranged in a line are held by a holding tape 564 which is wound on the reel 562. Each of the connecting tapes 152 carries the tag chip 470 previously attached thereto. The connecting-tape feeding device 554 has pinch rollers and guide rollers 574. The pinch rollers are provided by a drive roller 570 which is connected with a drive motor as a drive source, and a driven roller 572 which is biased by a biasing device (not shown) so as to be forced against the drive roller 570. The holding tape 564 holding the connecting tapes 152 is fed by the connecting-tape feeding device 554, to an-information writing position which is located below the information writing device 556. In a supplying position located on a downstream side of the writing position as viewed in the feed direction, there is provided the supplying portion 558 which includes a supplying port (receiving port) 580 allowing supply of the connecting tape 152 after the information has been written to the tag chip 470. The rollers 570, 572, 574 are positioned relative to one another such that the holding tape 565 is bent at an acute angle between the writing and supplying positions, whereby each connecting tape 152 is peeled off from the holding tape 564, and is then fed out through the supplying port 580. The holding tape 564 from which the connecting tape 152 has been peeled off is stored in the holding-tape storing portion 560.

The RAM 208 of the control device 200 stores various programs and data such as a main routine, a program for mounting the components 34 onto the printed-wiring board 12, a program for replenishing each feeder 82 with the components 34, and a program for effecting the erroneous-connection preventing program described later.

The above-described host computer 218 is a computer for controlling a plurality of systems such as the electronic-circuit-component mounting system, and has information relating to each of the systems. For example, the information relating to the electronic-circuit-component mounting system is a data set relating to the operation for mounting the components 34 onto the printed-wiring board 12. Such a data set includes data elements indicative of kind, number, mounting order (attached positions in the feeder support base 92) of the feeders 82 to be mounted on the feeder support base 92, and kind of the reel 110 to be held by each feeder 82, which are determined depending on kind of the printed-wiring board 12, and data elements indicative of number of the components 34 to remain in each feeder 82 upon completion of supply to each printed-wiring board 12, kind and number of the printed-wiring boards 12 onto which the components 34 are to be mounted, kinds of the components 34 to be mounted onto each printed-wiring board 12, and mounting positions in each printed-wiring board 12 in which the components 34 to be mounted. The host computer 218 and the computer 202 (hereinafter referred to as system computer 202) of the control device 200 of the electronic-circuit component mounting system communicate with each other, so that exchange of information and supply of commands are made therebetween whereby required data is supplied to the system computer 202.

The above-described control device 200 and the host computer 218 cooperate with each other to have function to manage the number of the components 34 remaining in each feeder 82 of the component supplying device 20 and each tray 84 of the component supplying device 22. The host computer 218 is provided with a remaining component memory which memories the number of the components 34 remaining or stored in each feeder 82 and tray 84, in relation with identification code of each feeder 82 and tray 84, so that the host computer 218 provides the control device 200 with data indicative of number of the components 34 currently stored or remaining in each feeder 82 or tray 84 when each feeder 82 or tray 84 is mounted onto the component supplying device 20 or 22. The control device 200 is adapted to memorize the number of the components stored or remaining in each feeder 82 or tray 84, and to update the data indicative of the number of the remaining components every time each one of the components 34 is supplied from each feeder 82 or tray 84. Further, every time supply of the components 34 by the following component tape 100 (or new tray 84) is initiated, the data is reset to number of the components 34 held by the following component tape 100 (or new tray 84).

The above-described "initiation of the supply of the components by the following component tape 100" can be detected in various manners. However, in the present embodiment, it is detected by detecting a fact that a predetermined number of the components 34 have been supplied by the preceding component tape 100 after the detection of the connecting portion of the two component tapes 100 by the tag chip reader 490. The number of the components 34 held by the preceding component tape 100, extending from the connecting portion to the component supplying position, at the point of time at which the connecting portion is detected is known. Therefore, when the known number of the components 34 have been supplied, the leading end of the following component tape 100 reaches the component supplying position, for initiating the supply of the components 34 by the following component tape 100.

The control device 200 updates the number of the components 34 remaining in each feeder 82 and tray 84, as described above, and transmits the data indicative of the number of the remaining components 34 to the host computer 218 when the feeder 82 or tray 84 is removed from the component device 20 or 22. The host computer 218 updates the content of the remaining component memory, in accordance with the data transmitted from the control device 200.

When the component tape 100 wound on the reel 110 has been almost exhausted of the components 34 as a result of successive supply of the components 34, the control device 200 informs the operator of this fact. Described specifically, when the number of the components 34 remaining in each feeder 82 or tray 84 becomes equal to or smaller than a predetermined number, the fact is informed by the indication on the display screen, and at the same time the informing device 246 is activated. In response to that, the operator replenishes the feeder 82 or tray 84 with the component tape 100.

There will be described a component mounting operation in the present electronic-circuit component mounting system.

A preparation is first made prior to initiation of the mounting operation. Before the plurality of feeders 82 are mounted onto the feeder support base 92, the component tape 100 is mounted onto each of the feeders 82. In this instance, the bar code 112 provided in each of the reel 110 and feeder 82 (the bar code provided in each feeder 82 is not shown) is read by the bar code reader 230. The bar code provided in each feeder 82 has feeder information recorded therein. The feeder information includes a feeder identification code which indicates kind of the corresponding feeder 82 and identifies the corresponding feeder 82. It is determined whether the bar code 112 of the reel 110 is a predetermined code (or corresponds to the bar code of the feeder 82 onto which the reel 110 is to be mounted). If the bar code 112 is not the predetermined code, the operator is informed of this fact by the informing device 246. The read bar code 112 is stored into the RAM 208. After the reel 110 is mounted onto the reel holding portion 120, each feeder 82 is attached to a predetermined attached position in the feeder support base 92.

In the present electronic-circuit component mounting system, for mounting each component 34 onto the printed-wiring board 12, the component holding device 30 is moved by the component-holding-device moving device 32 to the supplying portion of the feeder 82, and then lowered by the above-described component-holding-device elevating device so as to hold the component 34. The component 34 held by the component holding device 30 is moved to the printed-wiring board 12. On its way to the printed-wiring board 12, when the component 34 passes by the component-image taking system 70, the image of the component 34 is taken by the component camera 72, for obtaining a center position error and an angular position error of the component 34 as held by the component holding device 30. The angular position error is corrected by rotation of the component holding device 30 by the above-described component-holding-device rotating device, while the center position error is corrected by compensating the distance of movement of the component holding device 30 to the printed-wiring board 12. In this instance, the distance of movement of the component holding device 30 is compensated further on the basis of a center position error and an angular position error of the mounting position on the printed-wiring board 12, which errors are recognized based on the taken images of the fiducial marks. When the component holding device 30 has been moved to be positioned above the mounting position, the component holding device 30 is lowered by the component-holding-device elevating device, so as to mount the component 34 onto the printed-wiring board 12.

When the number of the components 34 remaining in the component tape 100 wound on the reel 110 of each feeder 82 becomes small as a result of successive supply of the components 34, this fact is informed by the informing device 246 and the display screen, so that the feeder 82 in question is replenished with the components 34 in response to the informed fact. That is, in the feeder 82 (connectable feeder 82) in question, connection of the following component tape 100 with the currently used component tape 100 is effected by operator. The operator is thus informed of a fact that there exists the connectable feeder 82 in which the currently used component tape 100 can be connected to the following component tape 100, before the currently used component tape 100 is exhausted of the components 34. Therefore, in response to the informed fact, the operator can carry out the tape connecting operation and replenish the feeder 82 with the components 34, before the component tape 100 is exhausted of the components 34. Thus, owing to the tape connecting operation in the connectable feeder 82, the exhaustion of the components 34 is avoided or minimized. Further, the tape connecting operation can be made rapidly and accurately in accordance with the indication of the display screen. Further, owing to the activation of the informing device 246 and the connection of the tapes 100 in the connectable feeder 82, the feeder 82 can be replenished with the components 34 in an early stage, thereby avoiding delay of the replenishment and improving reliability in the supply of the components 34. In the present electronic-circuit component mounting system in which the component supplying device 20 is disposed in a fixed position, the tape connecting operation can be made irrespective of whether the components 34 are being currently supplied or not. It is noted that the operator may carry out the tape connecting operation every time each feeder 82 becomes connectable, or each time number of the connectable feeders 82 is equal to or larger than a predetermined number.

There will be described, by reference to FIG. 16, a component information providing method including a writing step of writing information relating to the components 34 of the component tape 100 held by the reel 110, to the tag chip 470 which is fixed to the connecting tape 512 serving to connect two component tapes 100 such that the written information is readable from the tag chip 470. In an information reading step as step 101 (hereinafter referred to as "S101": the other steps being similarly referred) of the component information providing method, the information relating to the components 34 is read by the bar code reader 230, from the bar code 112 provided in the reel 110 of the following component tape 100. The read information is supplied to the information writing device 556 of the connecting-tape supplying device 550 through the control device 200, so that (at least component identification data of) the information is readably written to the tag chip 470 in an information writing step as S102 of the component information providing method. In a tape connecting step as S103 of the method, the trailing end portion 140 of the preceding component tape 100 and the leading end portion 142 of the following component tape 100 are connected to each other through the connecting piece 150, while being positioned relative to each other. In this instance, the connecting tape 152 (carrying the tag chip 470 to which the component identification data has been written) is attached to the trailing and leading end portions 140, 142 of the tapes 100.

Figure 17:
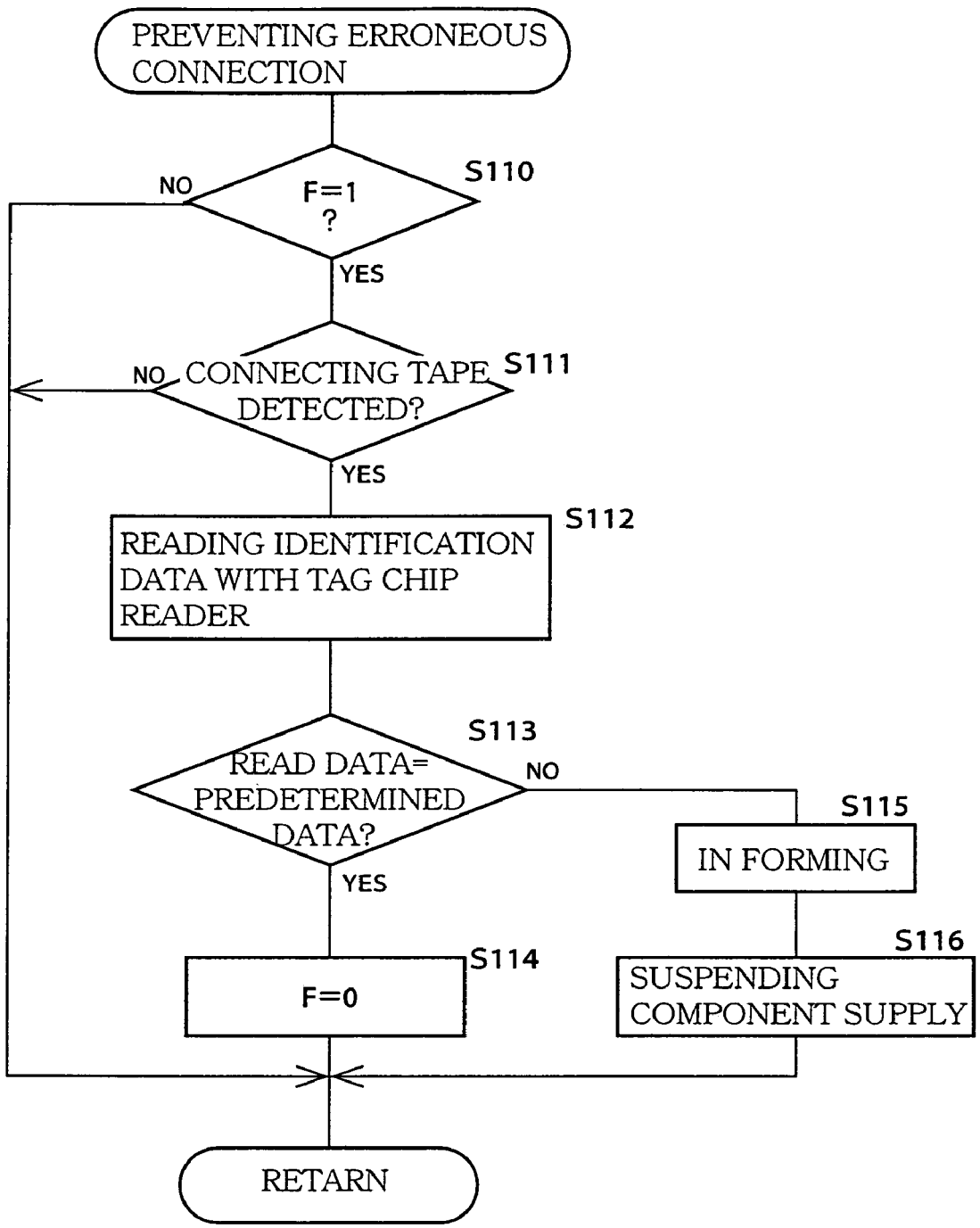
FIG. 17 is a flow chart showing an erroneous-connection preventing program stored in RAM of the above-described control device.

Next, there will be described, on the basis of the flow chart of FIG. 17, the erroneous-connection preventing program stored in the RAM 208. The present program is initiated with S110 in which it is determined whether a connection enable flag is in its ON state or not. As described above, when the number of the components remaining in any one of the feeders 82 is equal to or smaller than a predetermined number, the operator is informed of the fact that the following component tape 100 can be connected to the preceding component tape 100 in the feeder 82. In this instance, at the same time, the connection enable flag is set to ON. Since the connection enable flag is normally in its OFF state, the first execution of the erroneous-connection preventing program is terminated with a negative decision in S110. If an affirmative decision is obtained in S110, S111 is repeatedly implemented to determine whether the connecting tape 152 has been detected by the tag chip reader 490. Since the tape connecting operation is made by the operator in response to the above-described connection enable information, the connecting tape 152 is detected whereby an affirmative decision is obtained in S111. The affirmative decision in S111 is followed by S112 in which the component identification data written in the tag chip 470 is read by the tag chip reader 490 in S112.

In the subsequent S113, it is determined whether each data element of the read component identification data corresponds to the corresponding data element of the component identification data of the preceding component tape 100. The component identification data of the preceding component tape 100 is one example of predetermined information, and corresponds to the content of the bar code 112 of the reel 110, which has been read by the bar code reader 230 and stored into the RAM 208 when the feeder 82 has been mounted onto the feeder support base 92. Therefore, an affirmative decision in S113 means that the predetermined component tape 100 has been correctly connected. The affirmative decision in S113 is followed by S114 in which the connection enable flag is reset to OFF, so that the component supplying operation is continued. On the other hand, a negative decision in S113 means that a wrong component tape 100 has been erroneously connected. The negative decision in S113 is followed by S115 in which the operator is informed of this fact, 5116 is then implemented to suspend the supply of the components 34. In this instance, the supply of the components 34 from all the feeders 82 may be suspended, or alternatively, only the supply of the components 34 from the feeder 82 in which the wrong component tape 100 has been connected to the preceding component tape 100 may be suspended. In the latter case, it is preferable that the component supply from the feeder 82 whose supply has been suspended is preceded by the component supply from the other feeders 82, while the replenishment of the feeder 82 with a correct component tape is being awaited. Where there is mounted, on the feeder support base 92, another feeder 82 which supplies the same components 34 as those to be supplied by the feeder 82 whose supply has been suspended, it is preferable that the components 34 are supplied by this another feeder 82 in place of the feeder 82 in question.

In the present embodiment, the component identification data stored in the tag chip 470 is compared with the content of the bar code 112, as the predetermined component-tape code, which has been read when each feeder 82 has been mounted onto the feeder support base 92, not only in the first tape-connecting operation but also in the second and following tape-connecting operations effected for each feeder 82. However, the content of the predetermined component-tape code may be updated each time the tape-connecting operation is effected, such that the data content of the predetermined component-tape code corresponds to that of the tag chip 470 read after the previous tape-connecting operation. This arrangement makes it possible to easily deal with various cases such as a case where the information relating to the preceding component tape 100 and the information relating to the following component tape 100 are different from each other in data element thereof such as number of the components 34, and a case where the operator allows, even although the operator is informed of the above-described fact in S115, the supply of the components 34 by the following component tape 100.

In the present embodiment, S112 implemented by the control device 200 constitutes an information reading step, and the steps S113-S116 implemented by the control device 200 constitute a switch allowing/inhibiting step. The RAM 208 of the control device 200 constitutes a predetermined information storing portion. A portion of the control device 200 assigned to implement S113 constitutes a determining portion. The predetermined information storing portion and determining portion cooperate with a portion of the control device 20 assigned to implement S115, to constitute a different-information generating portion.

In the present embodiment, it is possible to prevent supply of wrong components 34 where two component tapes are spliced to each other. Since the connecting tape 152 is provided with the tag chip 470 which records the identification information of the following component tape 100, the information can be easily read by the tag chip reader 490 which is positioned above the tag chip 470. This arrangement is particularly favorable for reading the information while the feeder 82 is mounted on the feeder support base 92.

The information medium portion can be provided not only by the electronic tag but also by, for example, an information medium piece to and from which the information is writable and readable in the same principle as an optical disc or a magneto-optical disc. Where the information medium portion is provided by such an information medium piece, the information medium piece has to be opposed to an information reading device which reads the information from the information medium piece. As a measure for assuring that the information reading is done in a state where the information medium piece and the information reading device are precisely opposed to each other, a reading-enabling-condition detecting device may be provided to detect a condition which enables the information medium piece to be read by the information reading device. For example, in the above-described embodiment, a connecting-portion detecting device as an example of the reading-enabling-condition detecting device may be provided to detect a connecting portion of two component tapes which are connected to each other. The connecting-portion detecting device may be provided by a metal detector capable of detecting the connecting piece 150 made of a metallic material, and is arranged to detect the connecting portion of the two component tapes 100 by detecting the connecting piece 150. The detection of the connecting portion is made by the detection of the connecting piece 150, for example, in a manner similar to that disclosed in JP-A-2000-13092. The connecting-portion detecting device does not have to be provided necessarily by a contact-type sensor such as the above-described metal detector, but may be provided by a proximity sensor as a kind of non-contact-type sensor, a photoelectric sensor of light-reflection type or a photoelectric sensor of light-transmission type.

The information medium portion does not have to be provided in the connecting member such as the connecting tape, but may be provided in the component tape 100, for example, directly in the cover tape 104. In this case, it is preferable that the tape information medium portion is provided in a leading end portion or its vicinity of the cover tape 104 of the following component tape, so that the reading of the information and the determination as to the read information can be made in an early stage after the connection of the component tapes.

In the electronic-circuit-component mounting system in which each of the plurality of component supplying devices is disposed in a fixed position, the component supplying devices may be arranged to supply the electronic circuit components in the same manner. Alternatively, the component supplying devices may be arranged to supply the electronic circuit components in respective different manner, as long as at least one of the component supplying devices is provided by the feeder-type component supplying device.

The electronic-circuit-component mounting system may be provided by another type of the component mounting system different from the type of the system of each of the above-described embodiments. For example, the features of the present invention are equally applicable to the electronic-circuit-component mounting system including a component holding head which is equipped with a plurality of nozzle holders holding respective suction nozzles and which is turned about its axis so that each of the suction nozzles receives an electronic circuit component from the component supplying device in a component receiving position and then moves to a component mounting position so as to mount the component onto a circuit board held by the circuit-board holding device. Such a component mounting system includes a feeder support base which supports a plurality of component feeders (which may include not only a tape feeder but also a bulk feeder), and a support-base moving device which moves the feeder support base in such a manner that permits the plurality of component feeders to be moved in a direction parallel to a direction in which component supplying portions of the respective component feeders are arranged. The circuit-board holding device of such a system includes a relative movement device in the form of a XY movement device which is capable of moving the circuit board to a desired position on a plane parallel with the surface of the circuit board. For example, a component mounting system disclosed in JP-A-H06-342998 corresponds to this system. In this system, the information reading device (component-tape code recognizing device) is disposed in a fixed position, so that a desired feeder is moved by movement, of the feeder support base, so as to be positioned to be opposed to the fixed information reading device.

While the several embodiments of the present invention have been described in detail, for illustrative purpose only, it is to be understood that the present invention may be embodied with various modifications and improvements, such as those described in the SUMMARY OF THE INVENTION, which may occur to those skilled in the art.

The invention claimed is:

1. A component-tape connecting member for connecting a leading end portion of a component tape and a trailing end portion of another component tape, each of the component tapes including a carrier tape and a plurality of electronic circuit components arranged on and held by said carrier tape, and being to be fed in a longitudinal direction thereof for sequentially positioning the electronic circuit components in a component supplying position, said connecting member including an information medium portion which enables information to be readable from said information medium portion.

2. A component-tape connecting member according to claim 1, wherein said information medium portion enables the information to be readable from said information recording portion, without said information medium portion being brought into contact with a device which reads said information from said information medium portion.

3. A component-tape connecting member according to claim 1, wherein said information medium portion stores information relating to said component tape.

4. A component-tape connecting member according to claim 1, being a connecting tape.

5. A component-tape connecting member according to claim 1, wherein said information medium portion enables the information to be writable to said information medium portion.

6. A connecting-member supplying device for supplying the component-tape connecting member defined in claim 5, said connecting-member supplying device including:

an information reading and supplying device which reads, from a storing-member-information medium portion, information relating to the component tape, and which supplies said information, said storing-member-information medium portion being provided in a tape storing member which stores the component tape such that the component tape can be taken out of said tape storing member, with the leading end portion being first pulled out of said tape storing member;

an information writing device which writes at least a part of said information supplied from said information reading and supplying device, to a connecting-member information medium portion as said information medium portion provided in said component-tape connecting member, such that the written part of said information is readable from said connecting-member information medium portion; and a supplying portion which holds said component-tape connecting member, and allows supply of said connecting member after said part of said information is written to said connecting-member information medium portion by said information writing device.

7. An electronic-circuit-component supplying system using the component-tape connecting member defined in claim 5, said system including:

a tape feeder which includes (a) a storing-member holding portion holding a tape storing member storing the component tape, and (b) a feeding device feeding the component tape in said longitudinal direction, by taking the component tape out of said tape storing member, such that the leading end portion of the component tape is first pulled out of said tape storing member, whereby said electronic circuit components are sequentially positioned in the component supplying position;

an information reading and supplying device which reads, from a storing-member-information medium portion provided in said tape storing member, information relating to the component tape, and which supplies said information;

an information writing device which writes at least a part of said information supplied from said information reading and supplying device, to a connecting-member information medium portion as said information medium portion provided in said component-tape connecting member, such that the written part of said information is readable from said connecting-member information medium portion; and a supplying portion which holds said component-tape connecting member, and allows supply of said connecting member after said part of said information is written to said connecting-member information medium portion by said information writing device.

8. An electronic-circuit-component supplying system according to claim 7, further including:
- a connecting-member information reading device which is disposed in the vicinity of feed path of the component tape and which reads said written part of said information from said connecting-member information medium portion; and
- a different-information generating portion operable, when said part of said information read by said connecting-member information reading device is different from predetermined information, to generate information indicating that the read information is different from said predetermined information,
- wherein said electronic-circuit-component supplying system stops supply of said electronic circuit components in accordance with said information generated by said different-information generating portion.

9. An electronic-circuit-component mounting system using the component-tape connecting member defined in claim 5, said system including:
- a board holding device which holds a circuit board;
- a tape feeder which includes (a) a storing-member holding portion holding a tape storing member storing the component tape, and (b) a tape feeding device feeding the component tape in said longitudinal direction thereof, by taking the component tape out of said tape storing member, such that the leading end portion of said tape is first pulled out of said tape storing member, whereby the electronic circuit components are sequentially positioned in the component supplying position;
- an information reading and supplying device which reads, from a storing-member-information medium portion provided in said tape storing member, information relating to the component tape, and which supplies said information;
- an information writing device which writes at least a part of said information supplied from said information reading and supplying device, to a connecting-member information medium portion as said information medium portion provided in said component-tape connecting member, such that the written part of said information is readable from said connecting-member information medium portion;
- a supplying portion which holds said component-tape connecting member, and allows supply of said connecting member after said part of said information is written to said connecting-member information medium portion by said information writing device;
- a mounting device which receives the electronic circuit components from said tape feeder, and mounts the electronic circuit components onto said circuit board held by said board holding device;
- a connecting-member information reading device which is disposed in the vicinity of feed path of the component tape and which is operable, upon approximation of said connecting member to said reading device, to read said written part of said information from said connecting-member information medium portion; and
- a different-information generating portion operable, when said part of said information read by said connecting-member information reading device is different from predetermined information, to generate information indicating that the read information is different from said predetermined information.

10. A component-tape information providing method, by using the component-tape connecting member defined in claim 5, which is practiced for providing the information relating to one of the two component tapes, in said component-tape connecting member which includes a connecting-member information medium portion as said information medium portion and which connects the leading end portion of said one of the two component tapes with the trailing end portion of the other of the two component tapes that precedes said one of the two component tapes, so that supply of the electronic circuit components through the preceding component tape is followed by supply of the electronic circuit components through the following component tape, said method including:
- an information reading step of reading said information from a storing-member information medium portion which has said information stored therein and which is provided in a tape storing member storing said following component tape; and
- an information writing step of writing at least a part of the read information, to said connecting-member information medium portion provided in said component-tape connecting member, such that the written part of said information is readable from said connecting-member information medium portion.

11. An electronic-circuit-component supplying method by using the component-tape connecting member defined in claim 5, which is practiced for sequentially positioning the electronic circuit components in the component supplying position so as to supply said electronic circuit components, by feeding the component tapes in said longitudinal direction thereof, said method including:
- a component supplying step of supplying the electronic circuit components through a preceding component tape which is one of the component tapes;
- a first information reading step of reading, at latest before completion of supply of the electronic circuit components through said preceding component tape, information relating to another of the component tapes which follows the preceding component tape, from a storing-member information medium portion provided in a tape storing member which stores said another of the component tapes;
- an information writing step of writing at least a part of the read information, to a connecting-member information medium portion as said information medium portion provided in said component-tape connecting member, such that the written part of said information is readable from said connecting-member information medium portion;
- a tape connecting step of connecting the leading end portion of said another of the component tapes, to the trailing end portion of said preceding component tape, through said component-tape connecting member provided with said connecting-member information medium portion to which said at least part of said information has been written;
- a second information reading step of reading said at least part of said information written to said connecting-member information medium portion of said component-tape connecting member, when said connecting member reaches a predetermined position in step of the supply of said electronic circuit components through said preceding component tape; and
- a switch allowing/inhibiting step of allowing, if the read information corresponds to a predetermined information, switch from said supply of said electronic circuit components through said preceding component tape, to supply of said electronic circuit components through said another of the component tapes, while inhibiting said switch if said read information is different from said predetermined information.

12. An electronic-circuit-component supplying system using the component-tape connecting member defined in claim 1, said system comprising:
- a tape feeder which supplies each of the plurality of electronic circuit components to the component supplying position, by feeding the component tapes in said longitudinal direction thereof;
- a tape connecting device which connects the trailing end portion of the component tape as a preceding component tape and the leading end portion of the another component tape as a following component tape, through said component-tape connecting member which is provided with said information medium portion;
- a component-tape information reading device which reads component-tape information relating to the following component tape and represented by said information medium portion; and
- an information generating portion which generates variable information varying depending upon whether said component-tape information read by said component-tape information reading device corresponds to predetermined information or not.

13. An electronic-circuit-component supplying system according to claim 12,
- wherein said component-tape information reading device includes a component-tape code recognizing device which recognizes a component-tape code as said information medium portion provided in said component-tape connecting member,
- and wherein said information generating portion generates the variable information varying depending upon whether said component-tape information represented by said component-tape code, which is recognized by said component-tape code recognizing device, corresponds to said predetermined information or not.

14. An electronic-circuit-component supplying system according to claim 13, further including a component-tape code providing device which provides said component-tape code in said component-tape connecting member.

15. An electronic-circuit-component supplying system according to claim 14, further including:
- a code-carrying connecting-member preparing device which provides said component-tape code in said component-tape connecting member,
- wherein said code-carrying connecting-member preparing device includes:
  - a storing-member code recognizing device which recognizes a storing-member code provided in a tape storing member storing the component tape; and
  - a connecting-member code providing device which provides said component-tape connecting member with said component-tape code in the form of an identification code which represents information corresponding to said storing-member information which is represented by said storing-member code recognized by said storing-member code recognizing device.

16. An electronic-circuit-component mounting system using the component-tape connecting member defined in claim 1, said system including:
- a board holding device which holds a circuit board;
- a tape feeder which positions each of the plurality of electronic circuit components in the component supplying position, by feeding the component tapes connected to each other by said component-tape connecting member;
- a mounting device which receives the electronic circuit components positioned in said component supplying position by said tape feeder, and mounts said electronic circuit components onto said circuit board held by said board holding device;
- a tape information reading device which is disposed in the vicinity of feed path of the component tapes and which reads information from said information medium portion provided in said component-tape connecting member; and
- a different-information generating portion operable, when said information read by said tape information reading device is different from predetermined information, to generate information indicating that the read information is different from said predetermined information.

* * * * *